(12) United States Patent
Asaoka et al.

(10) Patent No.: US 12,457,884 B2
(45) Date of Patent: Oct. 28, 2025

(54) DISPLAY DEVICE AND METHOD FOR MANUFACTURING DISPLAY DEVICE

(71) Applicant: SHARP KABUSHIKI KAISHA, Sakai (JP)

(72) Inventors: Yasushi Asaoka, Sakai (JP); Sentaro Kida, Sakai (JP); Takahiro Adachi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 354 days.

(21) Appl. No.: 18/267,976

(22) PCT Filed: Dec. 22, 2020

(86) PCT No.: PCT/JP2020/047937
§ 371 (c)(1),
(2) Date: Jun. 16, 2023

(87) PCT Pub. No.: WO2022/137342
PCT Pub. Date: Jun. 30, 2022

(65) Prior Publication Data
US 2024/0114747 A1 Apr. 4, 2024

(51) Int. Cl.
*H10K 59/124* (2023.01)
*H10K 59/12* (2023.01)
*H10K 59/80* (2023.01)

(52) U.S. Cl.
CPC ... *H10K 59/80515* (2023.02); *H10K 59/1201* (2023.02); *H10K 59/124* (2023.02)

(58) Field of Classification Search
CPC .............. H10K 59/124; H10K 59/1204; H10K 59/80515

USPC .................................................. 313/498–512
See application file for complete search history.

(56) References Cited

U.S. PATENT DOCUMENTS

| | | | | |
|---|---|---|---|---|
| 2011/0198623 A1* | 8/2011 | Matsushima | ........ | H10K 59/122 438/34 |
| 2011/0204410 A1* | 8/2011 | Yada | ...................... | H05B 33/10 438/22 |
| 2013/0126848 A1* | 5/2013 | Harada | .................. | H10K 50/17 438/46 |
| 2014/0027792 A1* | 1/2014 | Iwasaki | .................. | H10H 20/83 257/99 |

(Continued)

FOREIGN PATENT DOCUMENTS

JP 2008-234932 A 10/2008

*Primary Examiner* — Christopher M Raabe
(74) *Attorney, Agent, or Firm* — ScienBiziP, P.C.

(57) ABSTRACT

A display device includes: a substrate; a pixel electrode disposed on the substrate, the pixel electrode including a first portion and a second portion disposed outside the first portion, the first portion protruding to a second side opposite to a first side closer to the substrate than the second portion; a light-emitting layer disposed across the second side of the first portion and the second side of the second portion; a first edge cover disposed across the second side of a side edge portion of the first portion and the second side of the second portion, the first edge cover including an opening formed on the second side of a central portion of the first portion, the first edge cover covering an edge of the first portion; and a counter electrode including a portion disposed closer to the second side than the first edge cover.

13 Claims, 28 Drawing Sheets

(56) References Cited

U.S. PATENT DOCUMENTS

2016/0172421 A1* 6/2016 Ando ................ H10K 59/122
                                                      438/34
2017/0294493 A1* 10/2017 Yoo ................. H10K 59/873
2025/0204163 A1*  6/2025 Jia .................... H10K 71/00
2025/0234715 A1*  7/2025 Shin ................ H10K 59/873

* cited by examiner

DISPLAY DEVICE AND METHOD FOR MANUFACTURING DISPLAY DEVICE

TECHNICAL FIELD

The disclosure relates to a display device and a method for manufacturing the display device.

BACKGROUND ART

A technique described in PTL 1 relates to a method for manufacturing an organic EL display device (paragraph 0036).

In the manufacturing method, an underlayer having a step is formed (paragraph 0038).

Subsequently, a partition for separating each pixel is formed (paragraphs 0025 and 0038). In a valid portion of the underlayer exposed from the partition, a central portion and a recessed portion recessed from the central portion are formed by the step (paragraph 0039). A surface of the partition has liquid repellency with respect to a polymer-based material for forming an organic active layer (paragraphs 0025 and 0038).

Subsequently, a liquid material is applied to the valid portion of the underlayer to form a coating layer (paragraphs 0027 and 0040).

Subsequently, the coating layer is heated and dried to form an organic active layer including a light-emitting layer (paragraphs 0023 and 0040).

According to the manufacturing method, when the liquid material is applied to the valid portion of the underlayer, the liquid material that has run onto the partition and the liquid material that has reached the central portion of the valid portion of the underlayer easily flow down toward the recessed portion of the valid portion of the underlayer (paragraph 0027). Thus, thinning of a peripheral portion of the organic active layer can be suppressed (paragraph 0027). In this way, a short circuit can be prevented from occurring between two electrodes (paragraph 0028). Further, a decrease in lifetime due to current concentration on a thinned portion of the organic active layer can be suppressed (paragraph 0028).

CITATION LIST

Patent Literature

PTL 1: JP 2008-234932 A

SUMMARY

Technical Problem

According to the above-described manufacturing method, thinning of the peripheral portion of the organic active layer can be suppressed to some extent. However, since a thickness of a side edge portion of the portion of the light-emitting layer formed on the central portion of the valid portion of the underlayer cannot be made uniform, a current concentrates on the portion, and the entire light-emitting layer cannot be caused to emit light uniformly.

This problem also occurs in display devices other than the organic EL display device.

In light of the problem, the disclosure has been conceived. An object of the disclosure is to provide a display device in which light emission intensity in a light-emitting region can be made uniform, and a method for manufacturing the display device.

Solution to Problem

A display device according to one aspect of the disclosure includes: a substrate; a pixel electrode disposed on the substrate, the pixel electrode including a first portion and a second portion disposed outside the first portion, the first portion protruding to a second side opposite to a first side closer to the substrate than the second portion; a light-emitting layer disposed across the second side of the first portion and the second side of the second portion; a first edge cover disposed across the second side of a side edge portion of the first portion and the second side of the second portion, the first edge cover including an opening formed on the second side of a central portion of the first portion, the first edge cover covering an edge of the first portion; and a counter electrode including a portion disposed closer to the second side than the first edge cover, and facing the pixel electrode with the light-emitting layer interposed between the counter electrode and the pixel electrode.

A method for manufacturing a display device according to another aspect of the disclosure includes: a) preparing a substrate; b) forming a pixel electrode disposed on the substrate, the pixel electrode including a first portion and a second portion disposed outside the first portion, the first portion protruding to a second side opposite to a first side closer to the substrate than the second portion; c) forming a peeling layer outside the second portion; d) forming a light-emitting material layer across the second side of the first portion, the second side of the second portion, and the second side of the peeling layer; e) forming, from the light-emitting material layer, a light-emitting layer disposed across the second side of the first portion and the second side of the second portion, by lifting off the peeling layer and a portion of the light-emitting material layer formed on the second side of the peeling layer; and f) forming, across the second side of a side edge portion of the first portion and the second side of the second portion, an edge cover including an opening located on the second side of a central portion of the first portion, the edge cover covering an edge of the pixel electrode.

DESCRIPTION OF EMBODIMENTS

Figure 1:
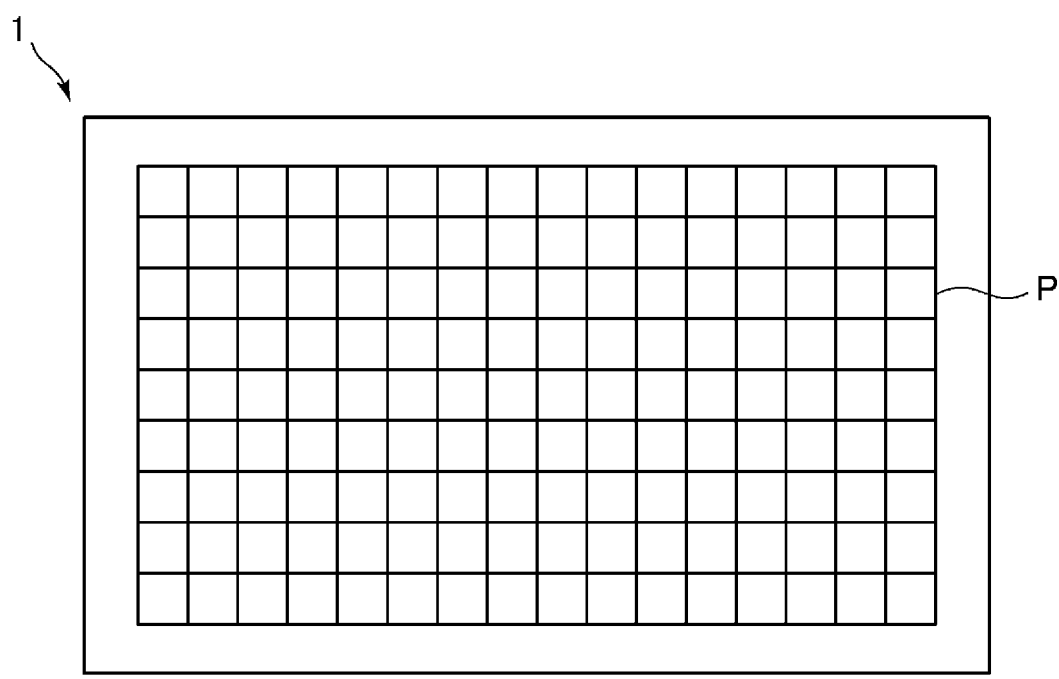
FIG. 1 is a plan view schematically illustrating a display device according to a first embodiment.

With reference to the drawings, embodiments of the disclosure will be described below. Note that, in the drawings, identical or equivalent elements are given an identical reference sign, and redundant descriptions thereof may be omitted.

1 General Concept on how Coating Liquid Wets Due to Characteristic of Bank

Figure 22A:
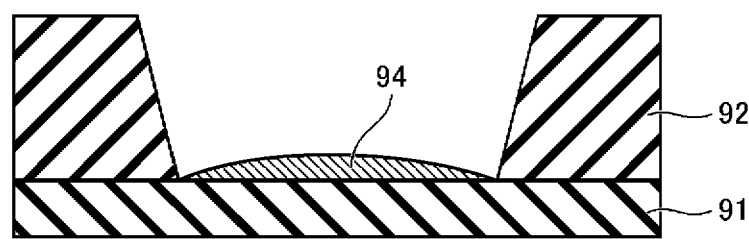
FIG. 22A is a cross-sectional view schematically illustrating a state in which a liquid-repellent bank and a light-emitting layer are formed on a substrate in a display device.
Figure 22B:
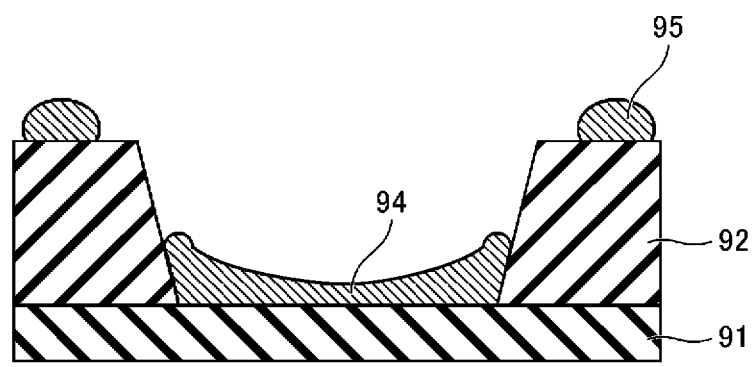
FIG. 22B is a cross-sectional view schematically illustrating the state in which the liquid-repellent bank and the light-emitting layer are formed on the substrate in the display device.

FIG. 22A and FIG. 22B are cross-sectional views schematically illustrating a state in which a liquid-repellent bank 92 and a light-emitting layer 94 are formed on a substrate 91 in a display device. FIG. 22A illustrates a case where the amount of a coating liquid applied to form the light-emitting layer 94 is small. FIG. 22B illustrates a case where the amount of the coating liquid applied to form the light-emitting layer 94 is great.

As illustrated in FIG. 22A, when the liquid-repellent bank 92 and the light-emitting layer 94 are formed on the substrate 91 and the amount of the coating liquid applied to form the light-emitting layer 94 is small, a thickness of a central portion of the light-emitting layer 94 is great and a thickness of a side edge portion of the light-emitting layer 94 is small.

As illustrated in FIG. 22B, when the liquid-repellent bank 92 and the light-emitting layer 94 are formed on the substrate 91 and the amount of the coating liquid applied to form the light-emitting layer 94 is great, a thickness of the central portion of the light-emitting layer 94 is small and a thickness of the side edge portion of the light-emitting layer 94 is great. A deposit 95 formed of the same material as a material constituting the light-emitting layer 94 is formed on the liquid-repellent bank 92. The deposit 95 has a great contact angle with respect to the liquid-repellent bank 92.

In a case where a layer other than the light-emitting layer 94 is formed on the liquid-repellent bank 92 by multilayer coating, even when the liquid-repellent bank 92 has liquid repellency, an underlayer of the light-emitting layer 94 does not necessarily have liquid repellency. When the liquid-repellent bank 92 has a high degree of liquid repellency, the adhesion of the light-emitting layer 94 to the liquid-repellent bank 92 decreases. When the display device has a high resolution, the coating liquid applied to form the light-emitting layer 94 is repelled by the liquid-repellent bank 92, and it is difficult to form the light-emitting layer 94 inside an opening of the liquid-repellent bank 92.

Figure 22C:
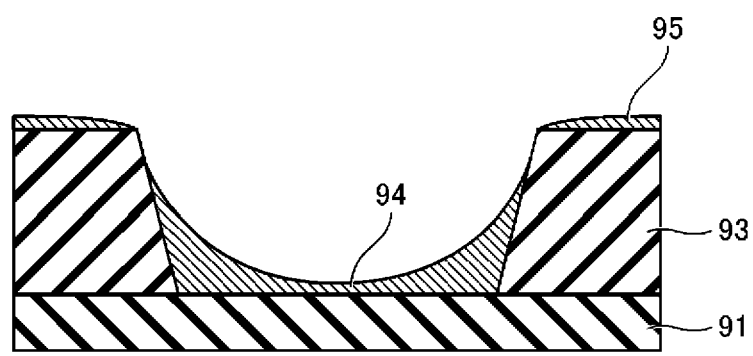
FIG. 22C is a cross-sectional view schematically illustrating a state in which a liquid-philic bank and the light-emitting layer are formed on the substrate in the display device.

FIG. 22C is a cross-sectional view schematically illustrating a state in which a liquid-philic bank 93 and the light-emitting layer 94 are formed on the substrate 91 in the display device.

As illustrated in FIG. 22C, when the liquid-philic bank 93 and the light-emitting layer 94 are formed on the substrate 91, a thickness of the central portion of the light-emitting layer 94 is small and a thickness of the side edge portion of the light-emitting layer 94 is great. The deposit 95 formed of the same material as a material constituting the light-emitting layer 94 is formed on the liquid-philic bank 93. The deposit 95 has a small contact angle with respect to the liquid-philic bank 93. Thus, the deposit 95 spreads to a corner of a protruding portion formed by the liquid-philic bank 93.

Figure 23:
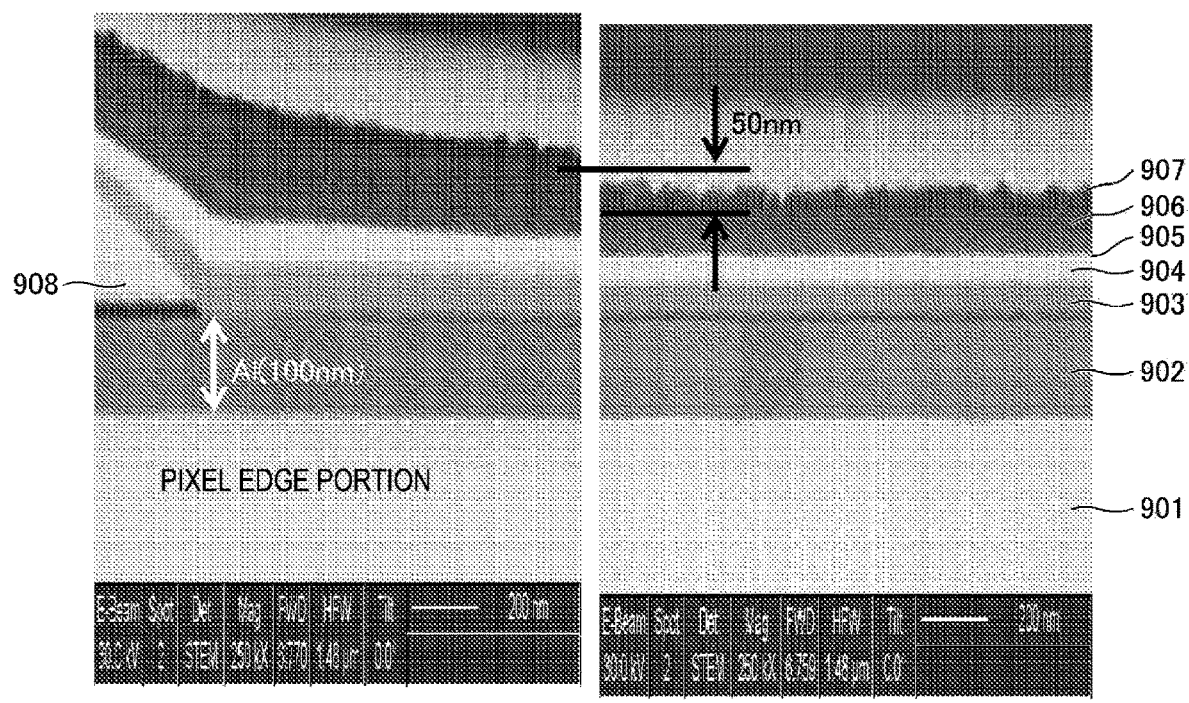
FIG. 23 is a cross-sectional scanning transmission electron microscope (STEM) image of an electroluminescent (EL) element prepared by a lift-off process.
Figure 24:
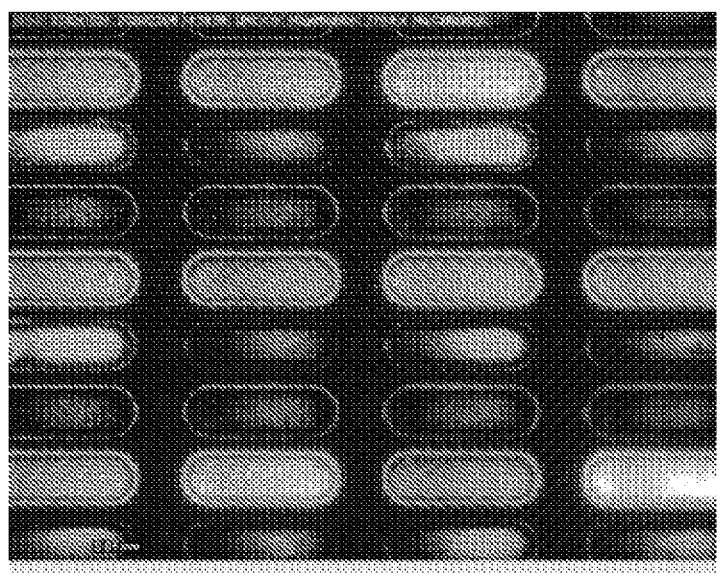
FIG. 24 is a plan image illustrating a state in which the EL element prepared by the lift-off process performs EL light emission.

FIG. 23 is a cross-sectional scanning transmission electron microscope (STEM) image of an electroluminescent (EL) element prepared by a lift-off process. A size of the STEM image in a horizontal direction is compressed to ⅓. FIG. 24 is a plan image illustrating a state in which the EL element performs EL light emission.

As illustrated in FIG. 23, the EL element includes a substrate 901, a pixel electrode 902, a hole injection layer 903, a hole transport layer 904, a light-emitting layer 905, an electron transport layer 906, a common electrode 907, and a hydrophilic bank 908.

The EL element is designed such that thicknesses of the function layers formed of the hole injection layer 903, the hole transport layer 904, the light-emitting layer 905, and the electron transport layer 906 are 120 nm. However, in the EL element, the thicknesses of the function layers are non-uniform in a light-emitting region. Specifically, the thickness of the function layer is small in a pixel central portion, and the thickness of the function layer is great in a pixel edge portion. As a result, there is a difference of about 50 nm between the thickness of the function layer in the pixel central portion and the thickness of the function layer in the pixel edge portion. When the thicknesses of the function layers are non-uniform in the light-emitting region in such a manner, a current density becomes non-uniform in the light-emitting region, light emission intensity becomes non-uniform in the light-emitting region as illustrated in FIG. 24, and the deterioration of a portion having a high current density progresses. Specifically, a current density of the pixel central portion where the thicknesses of the function layers are small increases, the light emission intensity of the pixel central portion increases, and the deterioration of the pixel central portion progresses.

2 First Embodiment 2.1 Planar Structure of Display Device

FIG. 1 is a plan view schematically illustrating a display device 1 according to a first embodiment.

The display device 1 is an organic light-emitting diode (OLED) display device, a quantum dot light emitting diode (QLED) display device, or the like. Hereinafter, it is assumed that the display device 1 is a QLED display device.

As illustrated in FIG. 1, the display device 1 includes a plurality of pixels P.

The plurality of pixels P are arrayed in a matrix. The plurality of pixels P may be arrayed in a non-matrix.

2.2 Planar Structure and Cross-Sectional Structure of Pixel

Figure 2:
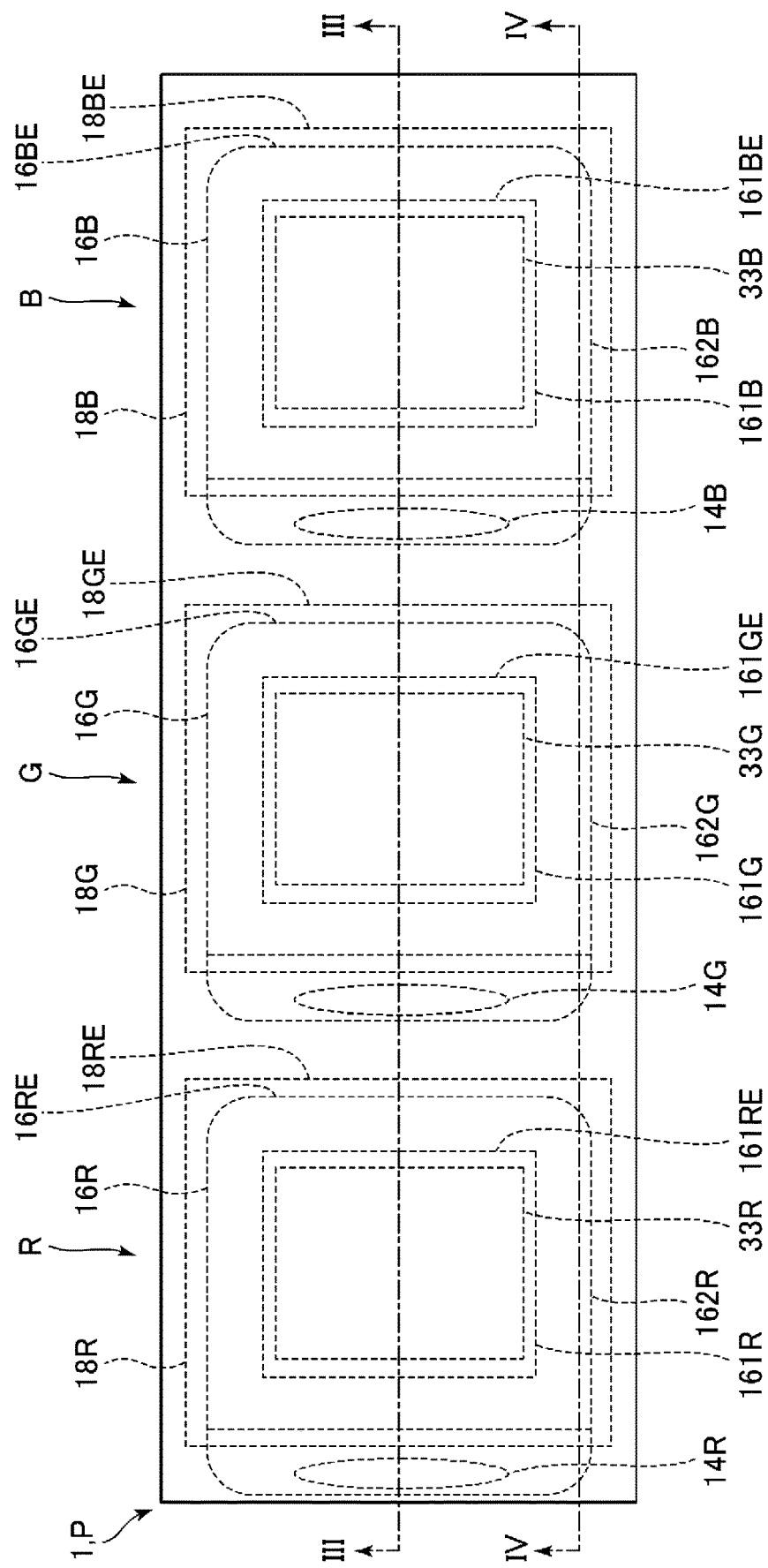
FIG. 2 is a plan view schematically illustrating each pixel included in the display device according to the first embodiment.
Figure 3:
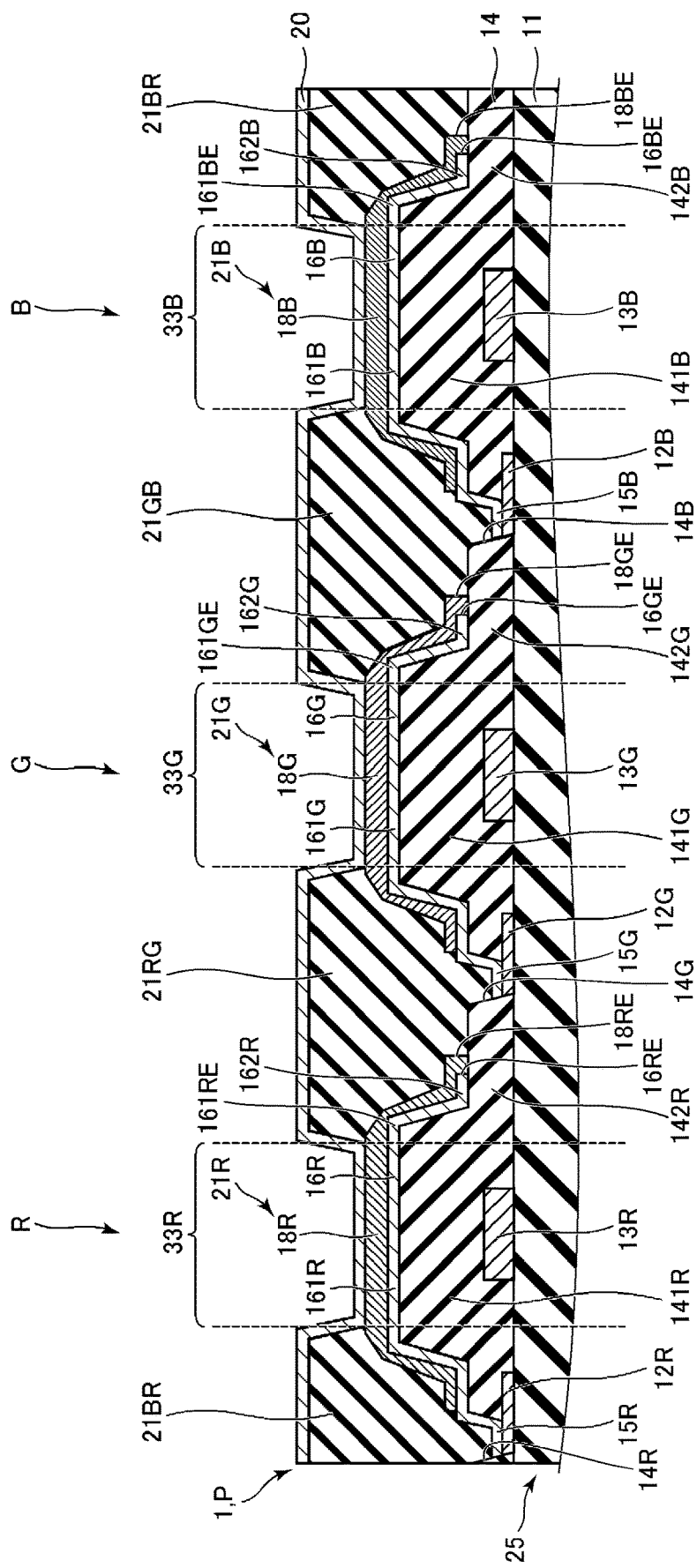
FIG. 3 is a cross-sectional view schematically illustrating each pixel included in the display device according to the first embodiment.
Figure 4:
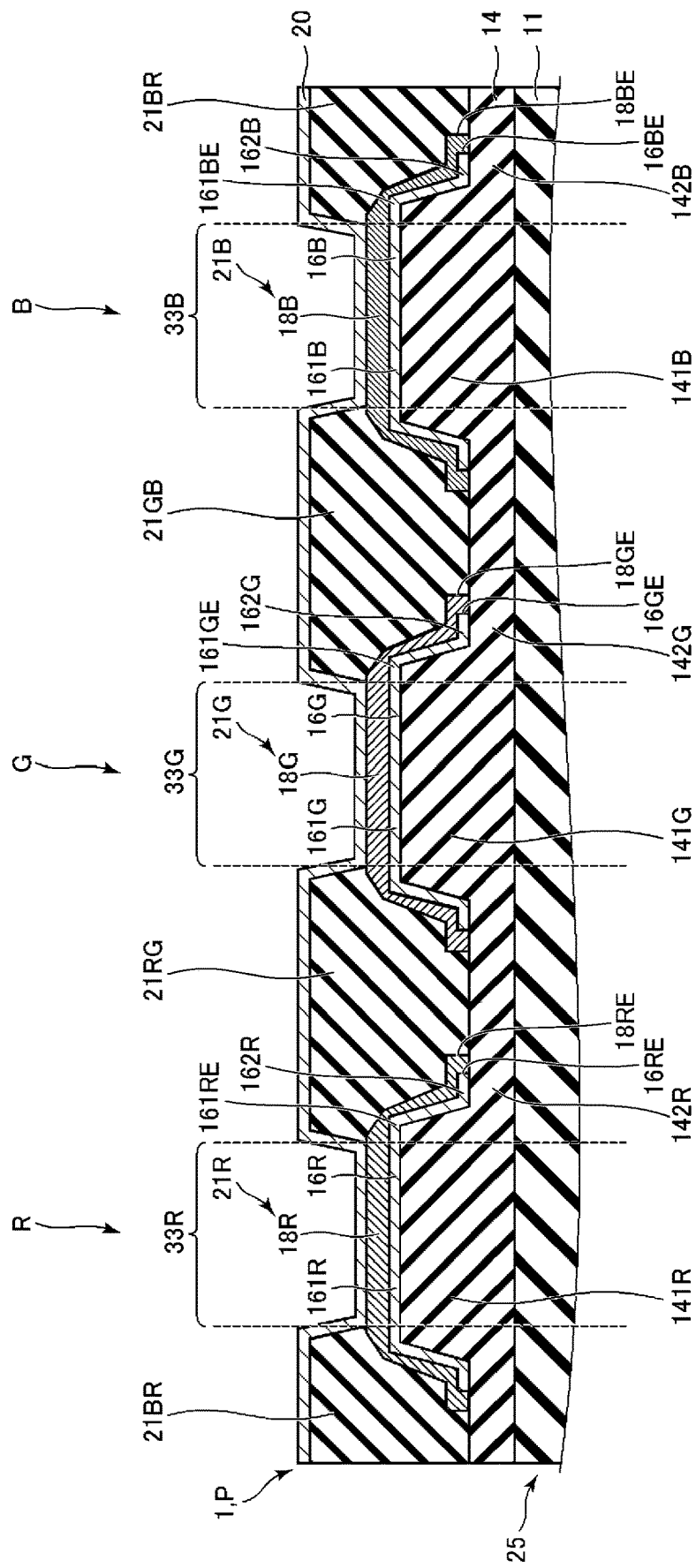
FIG. 4 is a cross-sectional view schematically illustrating each pixel included in the display device according to the first embodiment.

FIG. 2 is a plan view schematically illustrating each pixel P included in the display device 1 according to the first embodiment. FIG. 3 and FIG. 4 are cross-sectional views schematically illustrating each pixel P included in the display device 1 according to the first embodiment. FIG. 3 illustrates a section taken along a cutting line drawn in FIG. 2. FIG. 4 illustrates a section taken along a cutting line IV-IV drawn in FIG. 2.

As illustrated in FIG. 2, FIG. 3, and FIG. 4, the display device 1 includes pixels R, G, and B. The pixels R, G, and B are subpixels included in each pixel P included in the plurality of pixels P. Thus, each pixel P includes three subpixels that each emit red light, green light, and blue light. The number of the subpixels included in each pixel P may be increased or decreased from three. In this case, each pixel P may include a subpixel that emits light of a color other than red, green, and blue, or may include a plurality of subpixels that emit light of the same color.

The pixels R, G, and B emit red light, green light, and blue light respectively. The pixels R, G, and B may emit light of colors different from red, green, and blue, respectively.

The two pixels R and G included in each pixel P are adjacent to each other. The two pixels G and B included in each pixel P are adjacent to each other. The two pixels B and R included in the two adjacent pixels P are adjacent to each other.

As illustrated in FIG. 2, FIG. 3, and FIG. 4, the display device 1 includes a substrate 11, wiring lines 12R, 12G, and 12B, inorganic material structures 13R, 13G, and 13B, an interlayer insulating film 14, connection conductors 15R, 15G, and 15B, pixel electrodes 16R, 16G, and 16B, light-emitting layers 18R, 18G, and 18B, and a common electrode 20. The substrate 11, the wiring lines 12R, 12G, and 12B, the inorganic material structures 13R, 13G, and 13B, the interlayer insulating film 14, and the connection conductors 15R, 15G, and 15B constitute an array substrate 25.

The substrate 11, the interlayer insulating film 14, and the common electrode 20 are disposed across the plurality of pixels P. The wiring lines 12R, 12G, and 12B, the inorganic material structures 13R, 13G, and 13B, the connection conductors 15R, 15G, and 15B, the pixel electrodes 16R, 16G, and 16B, and the light-emitting layers 18R, 18G, and 18B are disposed in each pixel P.

The substrate 11, the interlayer insulating film 14, and the common electrode 20 are disposed across the pixels R, G, and B. The wiring line 12R, the inorganic material structure 13R, the connection conductor 15R, the pixel electrode 16R, and the light-emitting layer 18R are disposed in the pixel R. The wiring line 12G, the inorganic material structure 13G, the connection conductor 15G, the pixel electrode 16G, and the light-emitting layer 18G are disposed in the pixel G. The wiring line 12B, the inorganic material structure 13B, the connection conductor 15B, the pixel electrode 16B, and the light-emitting layer 18B are disposed in the pixel B.

As illustrated in FIG. 3 and FIG. 4, the display device 1 includes edge covers 21RG, 21GB, and 21BR.

The edge cover 21RG divides the pixel R and the pixel G. The edge cover 21GB divides the pixel G and the pixel B. The edge cover 21BR divides the pixel B and the pixel R.

The substrate 11, the wiring lines 12R, 12G, and 12B, the inorganic material structures 13R, 13G, and 13B, the interlayer insulating film 14, the connection conductors 15R, 15G, and 15B, the pixel electrodes 16R, 16G, and 16B, the light-emitting layers 18R, 18G, and 18B, and the common electrode 20 are disposed on the substrate 11.

Hereinafter, a first side closer to the substrate 11 of an element disposed on the substrate 11 is referred to as a lower side of the element. Further, a second side of the element opposite to the first side of the element is referred to as an upper side of the element.

The wiring lines 12R, 12G, and 12B and the inorganic material structures 13R, 13G, and 13B are disposed on an upper side of the substrate 11. The interlayer insulating film 14 is disposed on the upper side of the substrate 11 so as to overlap the wiring lines 12R, 12G, and 12B and the inorganic material structures 13R, 13G, and 13B. Contact holes 14R, 14G, and 14B are formed in the interlayer insulating film 14. The connection conductors 15R, 15G, and 15B are disposed inside the contact holes 14R, 14G, and 14B, respectively. The pixel electrodes 16R, 16G, and 16B are disposed on an upper side of the interlayer insulating film 14. The wiring lines 12R, 12G, and 12B include portions disposed on a lower side of the contact holes 14R, 14G, and 14B, respectively. The connection conductors 15R, 15G, and 15B are connected to the wiring lines 12R, 12G, and 12B, respectively, in the vicinity of end portions on the lower side of the contact holes 14R, 14G, and 14B. In this way, the connection conductor 15R electrically connects the pixel electrode 16R and the wiring line 12R to each other. The connection conductor 15G electrically connects the pixel electrode 16G and the wiring line 12G to each other. The connection conductor 15B electrically connects the pixel electrode 16B and the wiring line 12B to each other.

In the display device 1, the inorganic material structures 13R, 13G, and 13B are switching elements. The switching element is a thin film transistor (TFT) or the like. The pixel electrode 16R is electrically connected to the switching element 13R via the connection conductor 15R and the wiring line 12R. The pixel electrode 16G is electrically connected to the switching element 13G via the connection conductor 15G and the wiring line 12G. The pixel electrode 16B is electrically connected to the switching element 13B via the connection conductor 15B and the wiring line 12B.

The light-emitting layers 18R, 18G, and 18B are disposed on an upper side of the pixel electrodes 16R, 16G, and 16B, respectively. The edge cover 21RG is disposed across an upper side of an edge 16RE of the pixel electrode 16R, an upper side of an edge 18RE of the light-emitting layer 18R, an upper side of an edge 16GE of the pixel electrode 16G, and an upper side of an edge 18GE of the light-emitting layer 18G. The edge cover 21GB is disposed across the upper side of the edge 16GE of the pixel electrode 16G, the upper side of the edge 18GE of the light-emitting layer 18G, an upper side of an edge 16BE of the pixel electrode 16B, and an upper side of an edge 18BE of the light-emitting layer 18B. The edge cover 21BR is disposed across the upper side of the edge 16BE of the pixel electrode 16B, the upper side of the edge 18BE of the light-emitting layer 18B, the upper side of the edge 16RE of the pixel electrode 16R, and the upper side of the edge 18RE of the light-emitting layer 18R. The common electrode 20 is disposed across an upper side of the light-emitting layers 18R, 18G, and 18B and an upper side of the edge covers 21RG, 21GB, and 21BR. Thus, the common electrode 20 includes a portion disposed on the upper side of the light-emitting layers 18R, 18G, and 18B, and serves as a counter electrode facing the pixel electrodes 16R, 16G, and 16B with the light-emitting layers 18R, 18G, and 18B interposed therebetween, respectively. Further, the common electrode 20 includes a portion disposed on the upper side of the edge covers 21RG, 21GB, and 21BR. Thus, the edge covers 21RG, 21GB, and 21BR include portions disposed between the light-emitting layers 18R, 18G, and 18B and the common electrode 20.

2.3 Light Emission of Light-Emitting Element

The pixel electrodes 16R, 16G, and 16B are electrically connected to the light-emitting layers 18R, 18G, and 18B, respectively. In this way, first charges can be injected from the pixel electrodes 16R, 16G, and 16B into the light-emitting layers 18R, 18G, and 18B, respectively.

The common electrode 20 is electrically connected to the light-emitting layers 18R, 18G, and 18B. In this way, second charges can be injected from the common electrode 20 into the light-emitting layers 18R, 18G, and 18B.

When a potential difference is provided between the pixel electrode 16R and the common electrode 20, the first charges are injected from the pixel electrode 16R into the light-emitting layer 18R. Further, the second charges are injected from the common electrode 20 into the light-emitting layer 18R. As a result, the first charges and the second charges are recombined in the light-emitting layer 18R. Thus, the light-emitting layer 18R emits red light. When a potential difference is provided between the pixel electrode 16G and the common electrode 20, the first charges are injected from the pixel electrode 16G into the light-emitting layer 18G. Further, the second charges are injected from the common electrode 20 into the light-emitting layer 18G. As a result, the first charges and the second charges are recombined in the light-emitting layer 18G. Thus, the light-emitting layer 18G emits green light. When a potential difference is provided between the pixel electrode 16B and the common electrode 20, the first charges are injected from the pixel electrode 16B into the light-emitting layer 18B. Further, the second charges are injected from the common electrode 20 into the light-emitting layer 18B. As a result, the first charges and the second charges are recombined in the light-emitting layer 18B. Thus, the light-emitting layer 18B emits blue light.

2.4 Invert Structure and Conventional Structure

The display device 1 has an invert structure or a conventional structure.

When the display device 1 has the invert structure, the first charges are electrons. Further, the second charges are positive holes. The pixel electrodes 16R, 16G, and 16B are cathode electrodes. The common electrode 20 is an anode electrode.

When the display device 1 has the conventional structure, the first charges are positive holes. Further, the second charges are electrons. The pixel electrodes 16R, 16G, and 16B are anode electrodes. The common electrode 20 is a cathode electrode.

2.5 Function Layer

Figure 5:
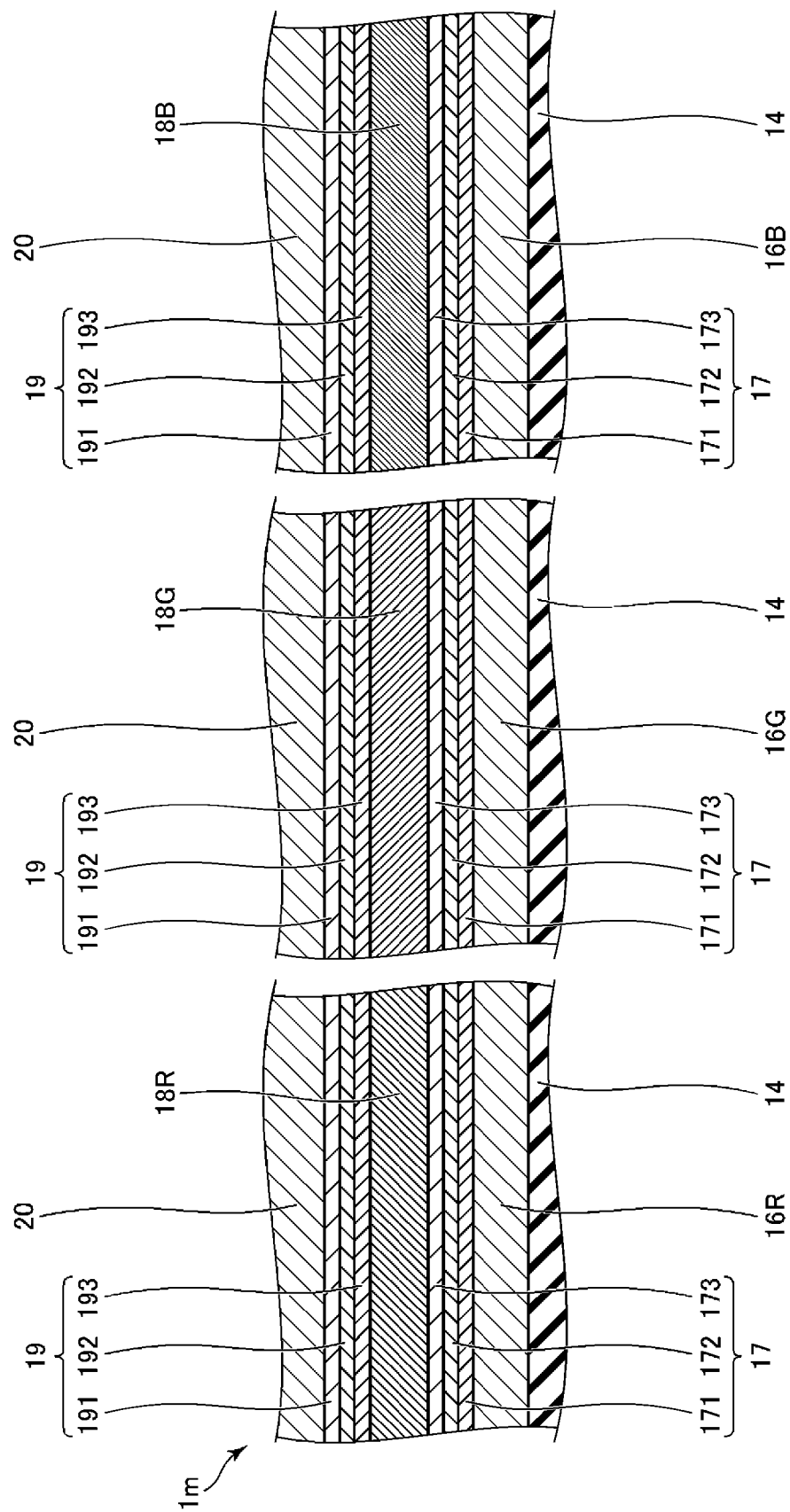
FIG. 5 is an enlarged cross-sectional view schematically illustrating the vicinity of function layers included in a display device according to a modified example of the first embodiment.

FIG. 5 is an enlarged cross-sectional view schematically illustrating the vicinity of function layers included in a display device 1m according to a modified example of the first embodiment.

As illustrated in FIG. 5, the display device 1m includes function layers 17 and 19.

The function layer 17 is disposed between the pixel electrode 16R and the light-emitting layer 18R, between the pixel electrode 16G and the light-emitting layer 18G, and between the pixel electrode 16B and the light-emitting layer 18B, and transports the first charges. The function layer 19 is disposed between the light-emitting layer 18R and the common electrode 20, between the light-emitting layer 18G and the common electrode 20, and between the light-emitting layer 18B and the common electrode 20, and transports the second charges.

As illustrated in FIG. 5, the function layer 17 includes at least one type selected from the group consisting of a charge injection layer 171, a charge transport layer 172, and a charge blocking layer 173. The function layer 19 includes at least one type selected from the group consisting of a charge injection layer 191, a charge transport layer 192, and a charge blocking layer 193.

When the display device 1m has the invert structure, the charge injection layer 171, the charge transport layer 172, and the charge blocking layer 173 are an electron injection layer, an electron transport layer, and an electron blocking layer, respectively. Further, the charge injection layer 191, the charge transport layer 192, and the charge blocking layer 193 are a hole injection layer, a hole transport layer, and a hole blocking layer, respectively.

When the display device 1*m* has the conventional structure, the charge injection layer 171, the charge transport layer 172, and the charge blocking layer 173 are a hole injection layer, a hole transport layer, and a hole blocking layer, respectively. Further, the charge injection layer 191, the charge transport layer 192, and the charge blocking layer 193 are an electron injection layer, an electron transport layer, and an electron blocking layer, respectively.

The function layers 17 and 19 are not patterned. In this way, the function layer 17 is disposed across the entire lower side of the light-emitting layers 18R, 18G, and 18B, and serves as an underlayer of the light-emitting layers 18R, 18G, and 18B. In this way, in the entire range in which the light-emitting layers 18R, 18G, and 18B are disposed, the wettability of light-emitting material layers 44R, 44G, and 44B described below with respect to the underlayer becomes uniform. This makes it easy to form the light-emitting material layers 44R, 44G, and 44B by coating, and to form the light-emitting layers 18R, 18G, and 18B by patterning the light-emitting material layers 44R, 44G, and 44B.

2.6 Material Constituting Each Layer

The pixel electrodes 16R, 16G, and 16B and the common electrode 20 are formed of a conductive material. The conductive material includes, for example, at least one type selected from the group consisting of a metal and a transparent conductive oxide. The metal includes, for example, at least one type selected from the group consisting of Al, Cu, Au, and Ag. The transparent conductive oxide includes, for example, at least one type selected from the group consisting of indium tin oxide (ITO), indium zinc oxide (IZO), zinc oxide (ZnO), aluminum zinc oxide (AZO), and boron zinc oxide (BZO). Each electrode of the pixel electrodes 16R, 16G, and 16B and the common electrode 20 may be one layer formed of one type of conductive material, or may be two or more layers formed of two or more types of the conductive materials different from each other. The two or more layers may include both a layer made of the metal and a layer made of the transparent conductive oxide.

The electron transport layer is formed of an electron transport material. The electron transport material includes, for example, at least one type selected from the group consisting of zinc oxide, magnesium zinc oxide, titanium oxide, and strontium titanium oxide. The zinc oxide is, for example, ZnO. The titanium oxide is, for example, $TiO_2$. The strontium titanium oxide is, for example, $SrTiO_3$. The electron transport material may be an electron transport material formed of one type of substance or an electron transport material formed of a mixture of two or more types of substances.

The hole transport layer is formed of a hole transport material. The hole transport material includes, for example, at least one type selected from the group consisting of a hole transport inorganic material and a hole transport organic material. The hole transport inorganic material includes, for example, at least one type selected from the group consisting of an oxide, a nitride, and a carbide of a metal. The metal includes at least one type selected from the group consisting of Zn, Cr, Ni, Ti, Nb, Al, Si, Mg, Ta, Hf, Zr, Y, La, Sr, and Mo. Examples of the hole transport organic material includes at least one type selected from the group consisting of 4,4',4''-tris(9-carbazoyl)triphenylamine (TCTA), 4,4'-bis[N-(1-naphthyl)-N-phenyl-amino]-biphenyl (NPB), zincphthalocyanine (ZnPC), di[4-(N,N-ditolylamino)phenyl]cyclohexane (TAPC), 4,4'-bis(carbazol-9-yl)biphenyl (CBP), 2,3,6,7,10,11-hexacyano-1,4,5,8,9,12-hexaazatriphenylene (HATCN), poly(N-vinylcarbazole) (PVK), poly(2,7-(9,9-di-n-octylfluorene)-(1,4-phenylene-((4-sec-butylphenyl) imino)-1,4-phenylene (TFB), a poly(triphenylamine) derivative (Poly-TPD), and poly(3,4-ethylenedioxythiophene)/poly(-styrenesulfonic acid) (PEDOT-PSS). The hole transport material may be a hole transport material formed of one type of substance or a hole transport material formed of a mixture of two or more types of substances.

The light-emitting layers 18R, 18G, and 18B are formed of a red light-emitting material, a green light-emitting material, and a blue light-emitting material. Each light-emitting material of the red light-emitting material, the green light-emitting material, and the blue light-emitting material includes a quantum dot. The quantum dot is, for example, a semiconductor fine particle having a particle size of 100 nm or less. The semiconductor fine particle includes, for example, at least one type selected from the group consisting of a group II-VI compound, a group III-V compound, a group IV compound, and a compound having a perovskite structure. The group II-VI compound includes, for example, at least one type selected from the group consisting of MgS, MgSe, MgTe, CaS, CaSe, CaTe, SrS, SeSe, SrTe, BaS, BaSe, BaTe, ZnS, ZnSe, ZnTe, CdS, CdSe, CdTe, HgS, HgSe, and HgTe. The group III-V compound includes, for example, at least one type selected from the group consisting of GaAs, GaP, InN, InAs, InP, and InSb. The group IV compound includes, for example, at least one type selected from the group consisting of Si and Ge. When the semiconductor fine particle is formed of a compound having a perovskite structure, the compound having the perovskite structure is, for example, a complex halide perovskite. The complex halide perovskite includes, for example, at least one type selected from the group consisting of Cl, Br, and I. The semiconductor fine particle may be a semiconductor fine particle formed of the crystal, or may be a semiconductor fine particle that has a core/shell structure and includes a core formed of the crystal and a shell formed of a shell material having a wide band gap and overcoating the core. When the display device 1 is an OLED display device, each light-emitting material includes a polymer organic light-emitting material.

The edge covers 21RG, 21GB, and 21BR are formed of an insulator.

2.7 Equalization of Light Emission Intensity

As illustrated in FIG. 2, FIG. 3, and FIG. 4, the pixel electrodes 16R, 16G, and 16B include first portions 161R, 161G and 161B having a protruding shape, respectively. The pixel electrodes 16R, 16G, and 16B include second portions 162R, 162G, and 162B having a recessed shape, respectively.

The first portions 161R, 161G, and 161B are located on central portions of the pixel electrodes 16R, 16G, and 16B, respectively. The second portions 162R, 162G, and 162B are located on edge portions of the pixel electrodes 16R, 16G, and 16B, respectively. Thus, the second portions 162R, 162G, and 162B are disposed outside the first portions 161R, 161G, and 161B, respectively. The first portions 161R, 161G, and 161B protrude closer to the upper side than the second portions 162R, 162G, and 162B, respectively.

A step between the first portion 161R and the second portion 162R is formed by the inorganic material structure 13R. A step between the first portion 161G and the second portion 162G is formed by the inorganic material structure 13G. A step between the first portion 161B and the second portion 162B is formed by the inorganic material structure 13B. The inorganic material structures 13R, 13G, and 13B are disposed on a lower side of the pixel electrodes 16R, 16G, and 16, respectively. The inorganic material structures 13R, 13G, and 13B have a first height on a lower side of the first portions 161R, 161G, and 161B, respectively, and have a second height lower than the first height on a lower side of the second portions 162R, 162G, and 162B, respectively. In this way, the interlayer insulating film 14 includes first film portions 141R, 141G, and 141B disposed on the lower side of the first portions 161R, 161G, and 161B, respectively, and second film portions 142R, 142G, and 142B disposed on the lower side of the second portions 162R, 162G, and 162B, respectively, and the first portions 161R, 161G, and 161B protrude closer to the upper side than the second portions 162R, 162G, and 162B, respectively. The second height may be 0. In other words, the inorganic material structures 13R, 13G, and 13B may be integrated and disposed on the lower side of the first portions 161R, 161G, and 161B, respectively. The step may be formed by other methods. For example, the interlayer insulating film 14 may be formed by photolithography such that a thickness of the interlayer insulating film 14 is great on the lower side of the first portions 161R, 161G, and 161B and a thickness of the interlayer insulating film 14 is small on the lower side of the second portions 162R, 162G, and 162B.

The light-emitting layer 18R is disposed across an upper side of the first portion 161R and an upper side of the second portion 162R. The light-emitting layer 18G is disposed across an upper side of the first portion 161G and an upper side of the second portion 162G. The light-emitting layer 18B is disposed across an upper side of the first portion 161B and an upper side of the second portion 162B.

A central portion of the light-emitting layer 18R disposed on the upper side of the first portion 161R is a protruding portion overlapping the first portion 161R. An edge portion of the light-emitting layer 18R disposed on the upper side of the second portion 162R is a recessed portion overlapping the second portion 162R. The recessed portion is continuous from the protruding portion. The recessed portion extends along the entire outer periphery of the light-emitting layer 18R. A central portion of the light-emitting layer 18G disposed on the upper side of the first portion 161G is a protruding portion overlapping the first portion 161G. An edge portion of the light-emitting layer 18G disposed on the upper side of the second portion 162G is a recessed portion overlapping the second portion 162G. The recessed portion is continuous from the protruding portion. The recessed portion extends along the entire outer periphery of the light-emitting layer 18G. A central portion of the light-emitting layer 18B disposed on the upper side of the first portion 161B is a protruding portion overlapping the first portion 161B. An edge portion of the light-emitting layer 18B disposed on the upper side of the second portion 162B is a recessed portion overlapping the second portion 162B. The recessed portion is continuous from the protruding portion. The recessed portion extends along the entire outer periphery of the light-emitting layer 18B.

Figure 6A:
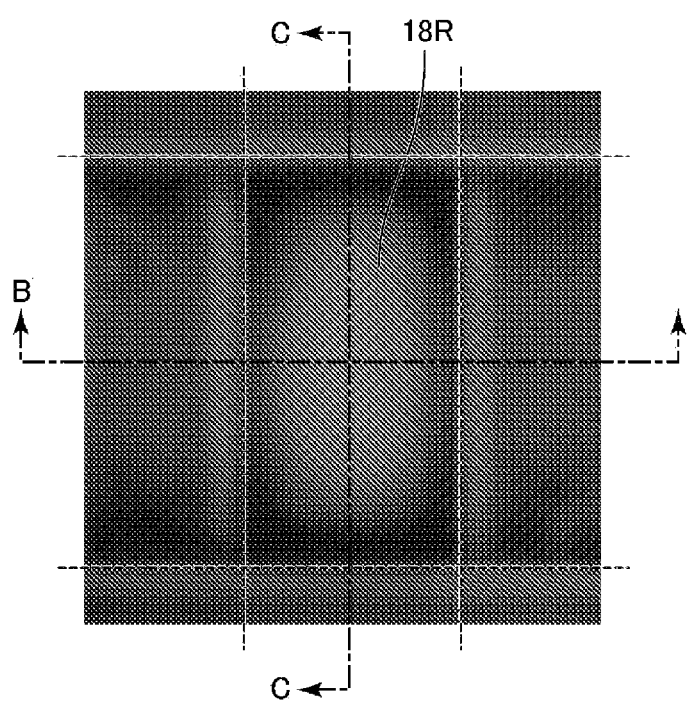
FIG. 6A is an image of an upper face of a light-emitting layer formed across an upper side of a protruding portion of an underlayer and an upper side of a recessed portion of the underlayer.
Figure 6B:
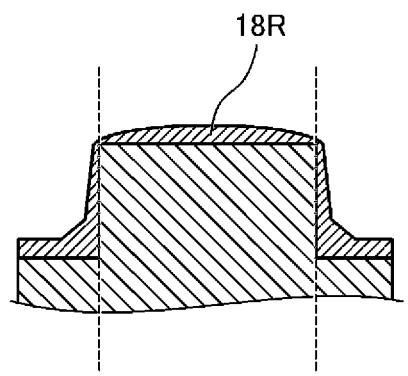
FIG. 6B is a cross-sectional view schematically illustrating the light-emitting layer formed across the upper side of the protruding portion of the underlayer and the upper side of the recessed portion of the underlayer.
Figure 6C:
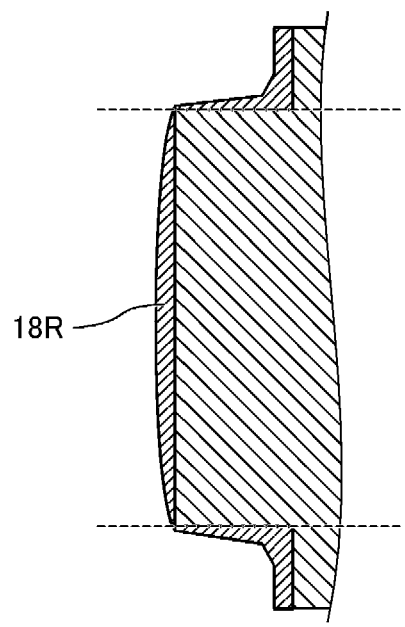
FIG. 6C is a cross-sectional view schematically illustrating the light-emitting layer formed across the upper side of the protruding portion of the underlayer and the upper side of the recessed portion of the underlayer.

FIG. 6A is an image of an upper face of the light-emitting layer 18R formed across an upper side of a protruding portion of an underlayer and an upper side of a recessed portion of the underlayer. FIG. 6B and FIG. 6C are cross-sectional views schematically illustrating the light-emitting layer 18R formed across the upper side of the protruding portion of the underlayer and the upper side of the recessed portion of the underlayer. FIG. 6B illustrates a section taken along a cutting line B-B drawn in FIG. 6A. FIG. 6C illustrates a section taken along a cutting line C-C drawn in FIG. 6A.

As illustrated in FIG. 6A, FIG. 6B, and FIG. 6C, when the light-emitting layer 18R is formed across the upper side of the protruding portion of the underlayer and the upper side of the recessed portion of the underlayer, the light-emitting layer 18R has a uniform thickness on an upper side of a central portion of the protruding portion, but has a non-uniform thickness on an upper side of a side edge portion of the protruding portion. Thus, when the entire portion of the light-emitting layer 18R formed on the upper side of the protruding portion is caused to emit light and the entire upper side of the protruding portion is included in the light-emitting region 33R that emits red light, the light emission intensity in the light-emitting region 33R becomes non-uniform. This problem may also occur in the light-emitting layers 18G and 18B.

As illustrated in FIG. 3 and FIG. 4, the edge covers 21BR and 21RG are disposed across an upper side of a side edge portion of the first portion 161R and the upper side of the second portion 162R. In the edge covers 21BR and 21RG, an opening 21R is formed on an upper side of a central portion of the first portion 161R. The opening 21R does not overlap the second portion 162R. In this way, the portion of the light-emitting layer 18R disposed on the upper side of the side edge portion of the first portion 161R and having a non-uniform thickness is covered by the edge covers 21BR and 21RG. Further, the portion of the light-emitting layer 18R disposed on the upper side of the central portion of the first portion 161R and having a uniform thickness is not covered by the edge covers 21BR and 21RG. Thus, the light-emitting region 33R that emits red light is limited to the portion having the uniform thickness. In this way, concentration of a current in the portion of the light-emitting layer 18R disposed on the upper side of the side edge portion of the first portion 161R and having a thin thickness can be suppressed, and the light emission intensity in the light-emitting region 33R can be made uniform.

Similarly, the edge covers 21RG and 21GB are disposed across an upper side of a side edge portion of the first portion 161G and the upper side of the second portion 162G. In the edge covers 21RG and 21GB, an opening 21G is formed on an upper side of a central portion of the first portion 161G. The opening 21G does not overlap the second portion 162G. In this way, the portion of the light-emitting layer 18G disposed on the upper side of the side edge portion of the first portion 161G and having a non-uniform thickness is covered by the edge covers 21RG and 21GB. Further, the portion of the light-emitting layer 18G disposed on the upper side of the central portion of the first portion 161G and having a uniform thickness is not covered by the edge covers 21RG and 21GB. Thus, the light-emitting region 33G that emits green light is limited to the portion having the uniform thickness. In this way, concentration of a current in the portion of the light-emitting layer 18G disposed on the upper side of the side edge portion of the first portion 161G and having a thin thickness can be suppressed, and the light emission intensity in the light-emitting region 33G can be made uniform.

Similarly, the edge covers 21GB and 21BR are disposed across an upper side of a side edge portion of the first portion 161B and the upper side of the second portion 162B. In the edge covers 21GB and 21BR, an opening 21B is formed on an upper side of a central portion of the first portion 161B. The opening 21B does not overlap the second portion 162B. In this way, the portion of the light-emitting layer 18B disposed on the upper side of the side edge portion of the first portion 161B and having a non-uniform thickness is covered by the edge covers 21GB and 21BR. Further, the portion of the light-emitting layer 18B disposed on the upper side of the central portion of the first portion 161B and having a uniform thickness is not covered by the edge covers 21GB and 21BR. Thus, the light-emitting region 33B that emits blue light is limited to the portion having the uniform thickness. In this way, concentration of a current in the portion of the light-emitting layer 18B disposed on the upper side of the side edge portion of the first portion 161B and having a thin thickness can be suppressed, and the light emission intensity in the light-emitting region 33B can be made uniform.

The edge covers 21BR and 21RG cover an edge 161RE of the first portion 161R forming a boundary between the first portion 161R and the second portion 162R. In this way, the edge 161RE of the first portion 161R that easily deteriorates is separated from the common electrode 20. This can suppress deterioration of the pixel electrode 16R.

Similarly, the edge covers 21RG and 21GB cover an edge 161GE of the first portion 161G forming a boundary between the first portion 161G and the second portion 162G. In this way, the edge 161GE of the first portion 161G that easily deteriorates is separated from the common electrode 20. This can suppress deterioration of the pixel electrode 16G.

Similarly, the edge covers 21GB and 21BR cover an edge 161BE of the first portion 161B forming a boundary between the first portion 161B and the second portion 162B. In this way, the edge 161BE of the first portion 161B that easily deteriorates is separated from the common electrode 20. This can suppress deterioration of the pixel electrode 16B.

The edge covers 21BR and 21RG cover the boundary between the protruding portion of the light-emitting layer 18R and the recessed portion of the light-emitting layer 18R, and the recessed portion of the light-emitting layer 18R. The edge covers 21RG and 21GB cover the boundary between the protruding portion of the light-emitting layer 18G and the recessed portion of the light-emitting layer 18G, and the recessed portion of the light-emitting layer 18G. The edge covers 21GB and 21BR cover the boundary between the protruding portion of the light-emitting layer 18B and the recessed portion of the light-emitting layer 18B, and the recessed portion of the light-emitting layer 18B.

The contact holes 14R, 14G, and 14B are disposed outside the second portions 162R, 162G, and 162B, respectively. In this way, interference of the respective contact holes 14R, 14G, and 14B with the light-emitting layers 18R, 18G, and 18B can be suppressed.

The edge covers 21RG, 21GB, and 21BR may not have liquid repellency and may have liquid affinity. The second portions 162R, 162G, and 162B may not be leveled by the light-emitting layers 18R, 18G, and 18B.

2.8 Overlapping of Light-emitting Layer

As illustrated in FIG. 3 and FIG. 4, two light-emitting layers disposed in two pixels adjacent to each other are separated from each other. For example, the light-emitting layers 18R and 18G disposed in the pixels R and G, respectively, are separated from each other. Further, the light-emitting layers 18G and 18B disposed in the pixels G and B, respectively, are separated from each other. Further, the light-emitting layers 18B and 18R disposed in the pixels B and R, respectively, are separated from each other. In this way, crosstalk between the two pixels via the two light-emitting layers can be suppressed.

Figure 7:
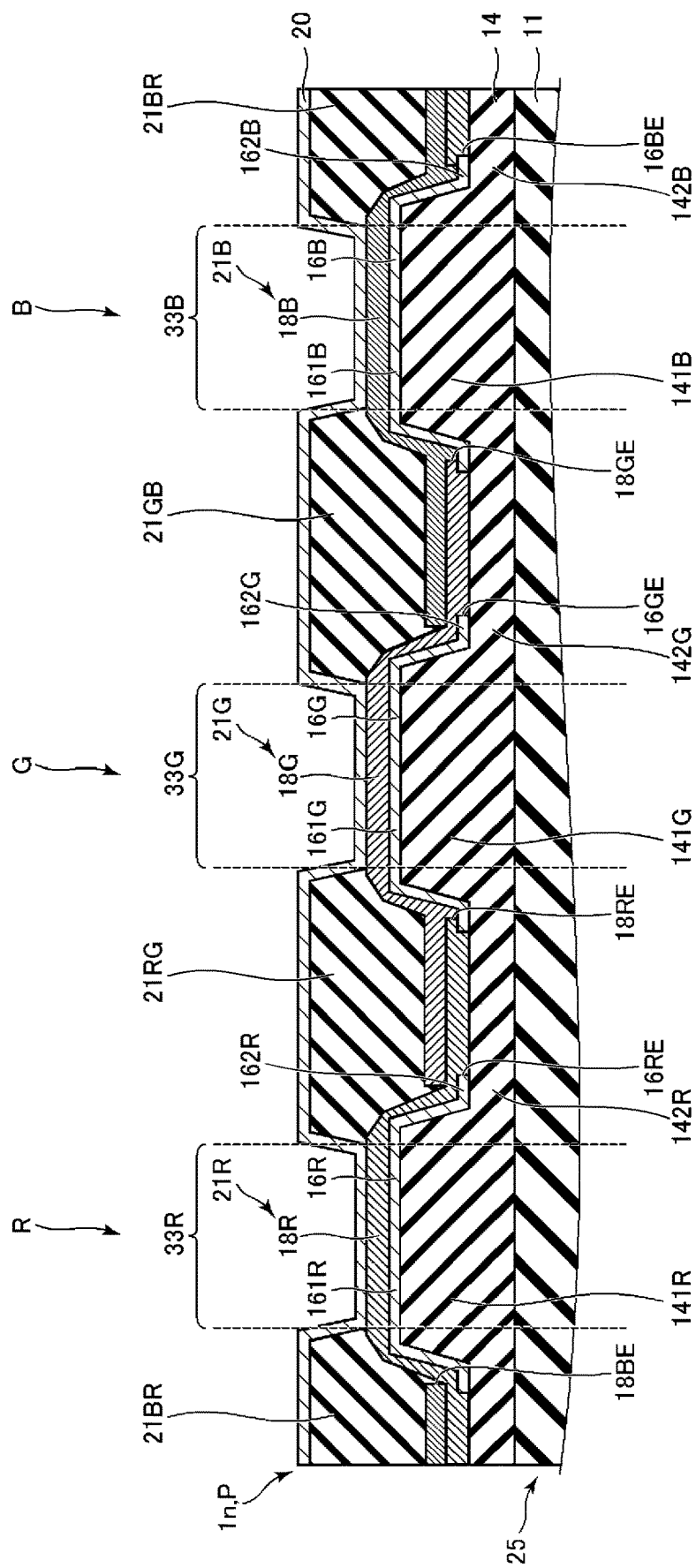
FIG. 7 is a cross-sectional view schematically illustrating each pixel included in a display device according to a modified example of the first embodiment.

FIG. 7 is a cross-sectional view schematically illustrating each pixel P included in a display device 1n according to a modified example of the first embodiment.

As illustrated in FIG. 7, in the display device 1n, side edge portions of two light-emitting layers disposed in two pixels adjacent to each other overlap each other. For example, the side edge portions of the light-emitting layers 18R and 18G disposed in the pixels R and G, respectively, overlap each other. Further, the side edge portions of the light-emitting layers 18G and 18B disposed in the pixels G and B, respectively, overlap each other. Further, the side edge portions of the light-emitting layers 18B and 18R disposed in the pixels B and R, respectively, overlap each other. In this way, planar shapes of the light-emitting layers 18R, 18G, and 18B can be increased. In this way, even when the display device 1 has a high resolution, the light-emitting layers 18R, 18G, and 18B can be formed by patterning.

2.9 Modified Example of Inorganic Material Structure

Figure 8:
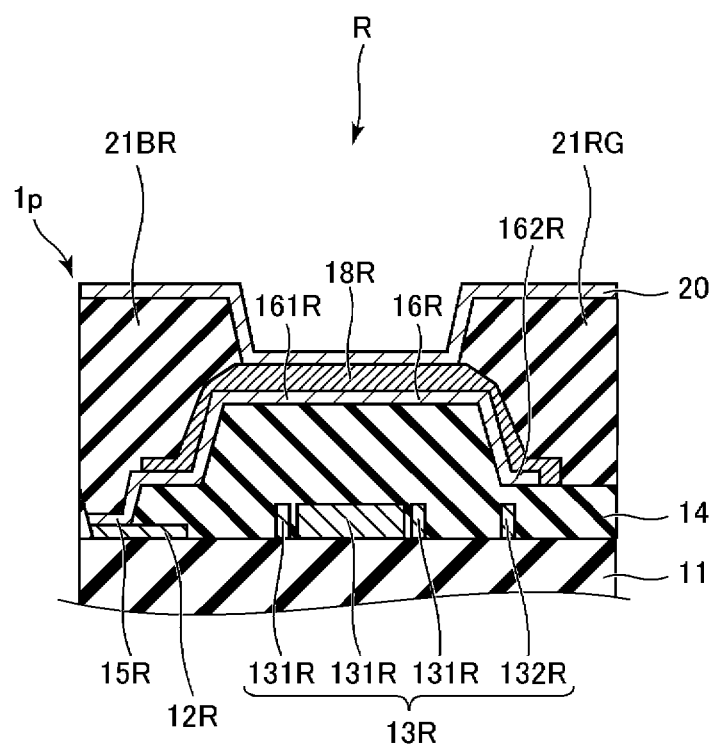
FIG. 8 is a cross-sectional view schematically illustrating the pixel included in a display device according to a modified example of the first embodiment.

FIG. 8 is a cross-sectional view schematically illustrating the pixel R included in a display device 1p according to a modified example of the first embodiment.

As illustrated in FIG. 8, in the display device 1p, the inorganic material structure 13R includes a first element 131R disposed on the lower side of the first portion 161R and a second element 132R disposed on the lower side of the second portion 162R. The number of the second elements 132R is smaller than the number of the first elements 131R. In this way, the amount by which the material constituting the interlayer insulating film 14 is pushed up on the lower side of the first portion 161R is greater than the amount by which the material constituting the interlayer insulating film 14 is pushed up on the lower side of the second portion 162R. Thus, the first portion 161R protrudes closer to the upper side than the second portion 162R.

The first element 131R includes at least one type selected from the group consisting of a first switching element, a first capacitor, and a first wiring line. The second element 132R includes at least one type selected from the group consisting of a second switching element, a second capacitor, and a second wiring line.

In the display device 1p, the inorganic material structure 13G causes the first portion 161G to protrude closer to the upper side than the second portion 162G in the same manner that the inorganic material structure 13R causes the first portion 161R to protrude closer to the upper side than the second portion 162R. Further, the inorganic material structure 13B causes the first portion 161B to protrude closer to the upper side than the second portion 162B.

2.10 Method for Manufacturing Display Device

Figure 9:
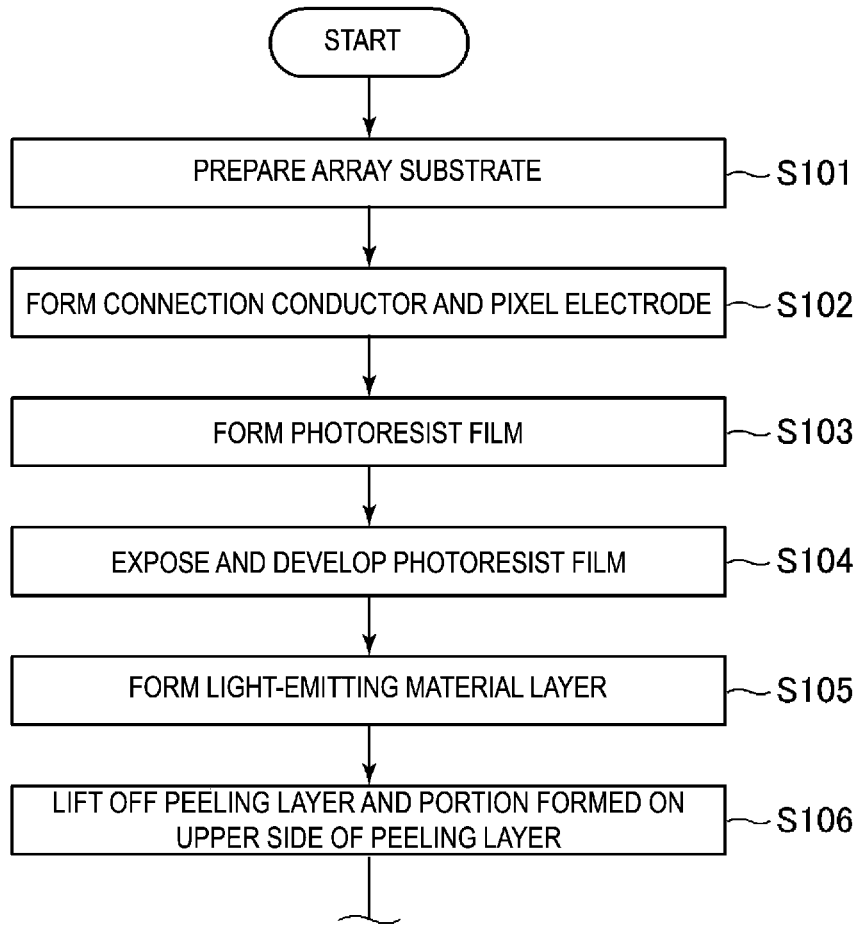
FIG. 9 is a flowchart illustrating a method for manufacturing a display device according to the first embodiment.
Figure 10:
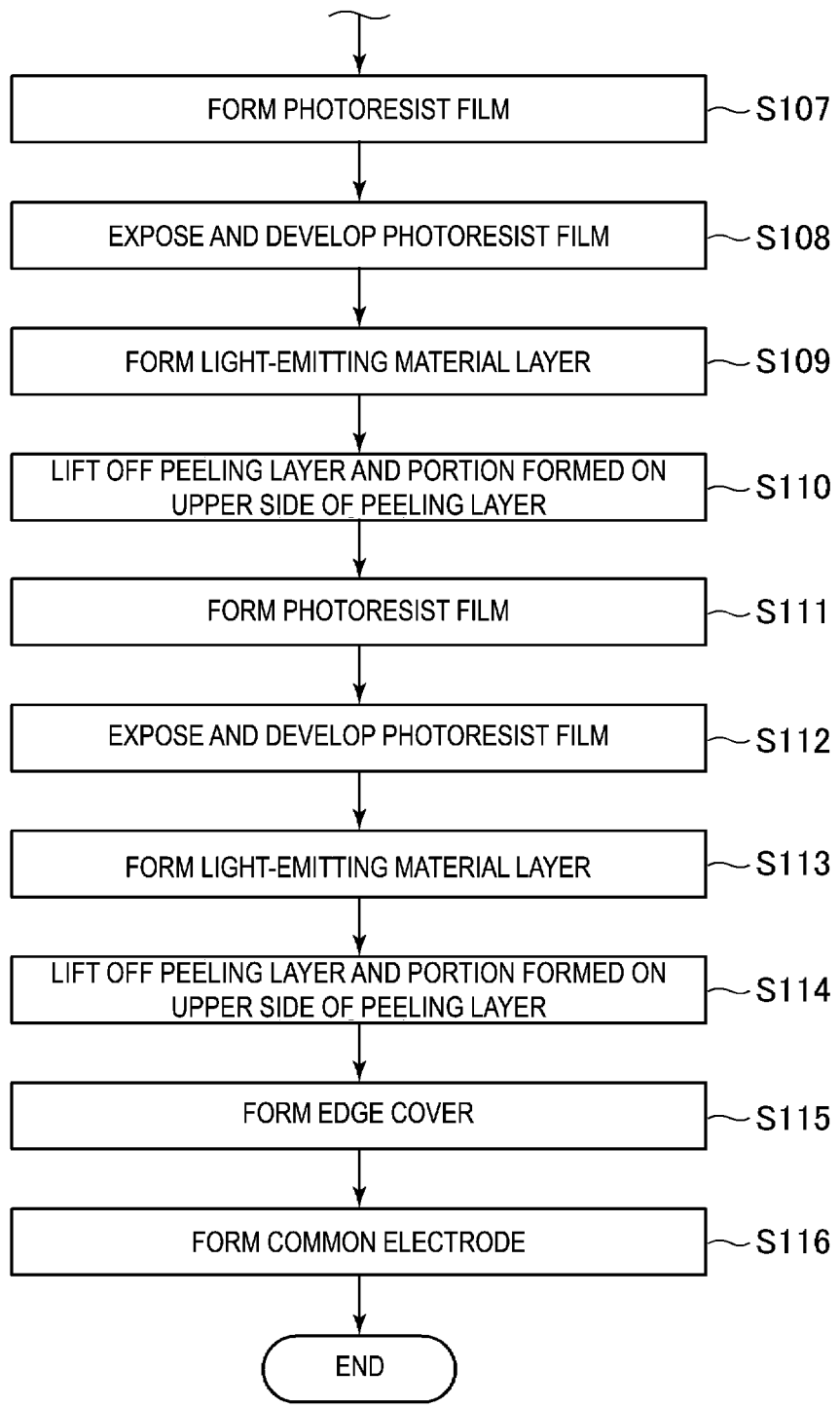
FIG. 10 is a flowchart illustrating the method for manufacturing a display device according to the first embodiment.

FIG. 9 and FIG. 10 are flowcharts illustrating a method for manufacturing the display device 1 according to the first embodiment. FIG. 11 to FIG. 19 are cross-sectional views schematically illustrating an intermediate product acquired in the method for manufacturing the display device 1 according to the first embodiment.

As illustrated in FIG. 9 and FIG. 10, the method for manufacturing the display device 1 includes steps S101 to S116.

Figure 11:
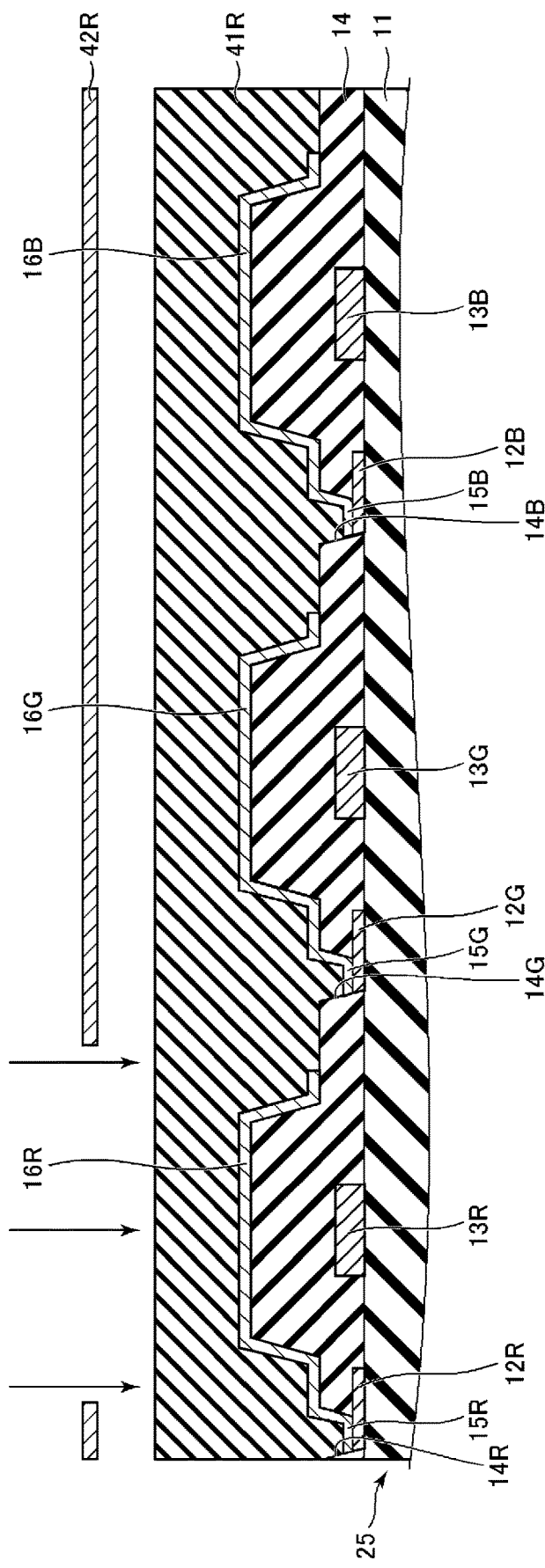
FIG. 11 is a cross-sectional view schematically illustrating an intermediate product acquired in the method for manufacturing a display device according to the first embodiment.

In step S101, the array substrate 25 illustrated in FIG. 11 is prepared. The array substrate 25 serves as an underlayer substrate.

In subsequent step S102, the connection conductors 15R, 15G, and 15B and the pixel electrodes 16R, 16G, and 16B illustrated in FIG. 11 are formed. The connection conductors 15R, 15G, and 15B are formed inside the contact holes 14R, 14G, and 14B, respectively. The pixel electrodes 16R, 16G, and 16B are formed on the array substrate 25.

In subsequent step S103, a photoresist film 41R illustrated in FIG. 11 is formed. The photoresist film 41R is formed on the array substrate 25 so as to overlap the pixel electrodes 16R, 16G, and 16B. The photoresist film 41R is formed of a positive resist. The positive resist becomes soluble in a developing solution when being irradiated with a photosensitive beam. The photosensitive beam may be an ultraviolet beam, an electron beam, or the like. The developing solution is an alkaline solution or the like. The developing solution may include a surfactant. The positive resist is formed of a material that does not dissolve in a solvent included in a coating liquid applied to form the light-emitting material layer 44R described below. The photoresist film 41R is formed by applying a coating liquid including a positive resist and a solvent to a surface to be coated to form a coating film, and evaporating the solvent from the formed coating film by heating. The coating liquid is TFR1000 or the like manufactured by Tokyo Ohka Kogyo Co., Ltd. The coating liquid is applied by die coating, ink-jet, spin coating, or the like.

In subsequent step S104, the photoresist film 41R is exposed through a mask 42R illustrated in FIG. 11. Further, the exposed photoresist film 41R is developed. At this time, a portion of the photoresist film 41R formed on the upper side of the pixel electrode 16R is irradiated with the photosensitive beam. Further, the portion irradiated with the photosensitive beam is dissolved in the developing solution.

Figure 12:
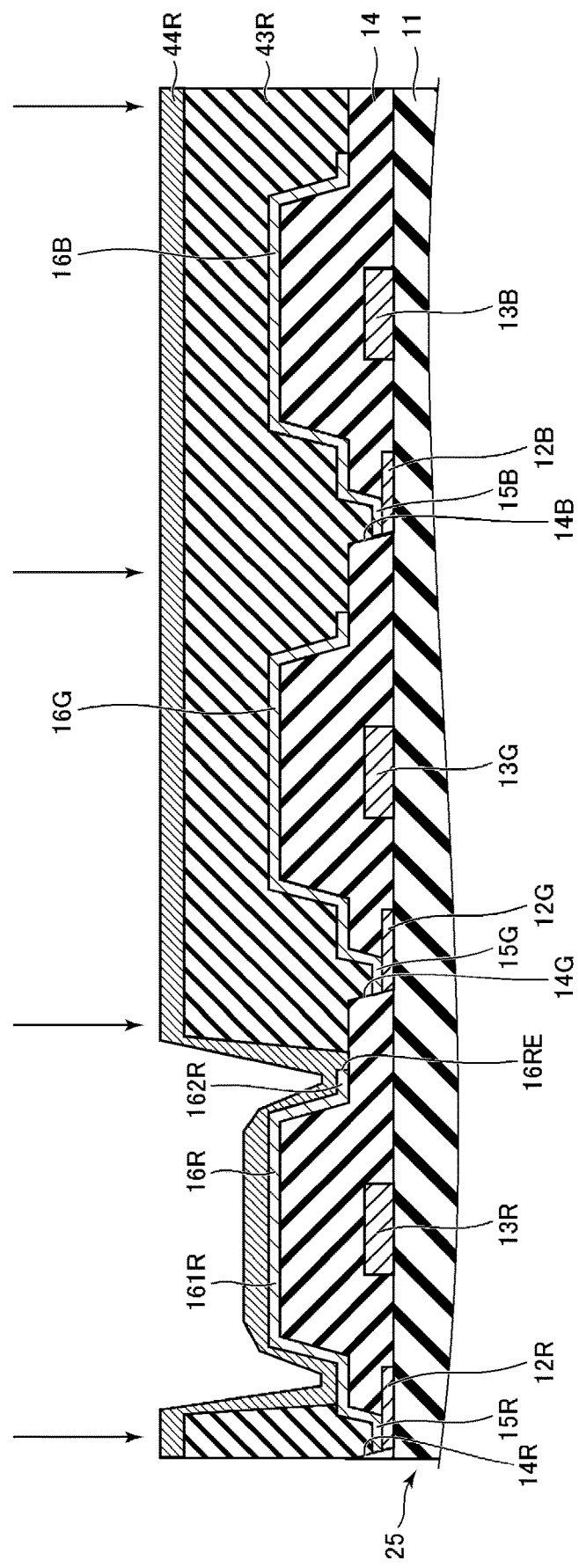
FIG. 12 is a cross-sectional view schematically illustrating an intermediate product acquired in the method for manufacturing a display device according to the first embodiment.

In steps S103 and S104, a peeling layer 43R illustrated in FIG. 12 is formed. The peeling layer 43R is formed outside the second portion 162R. An opening is formed in the peeling layer 43R and serves as a lift-off template. The second portion 162R is disposed inside the opening. The edge 16RE of the pixel electrode 16R may be disposed inside the opening.

In subsequent step S105, the light-emitting material layer 44R illustrated in FIG. 12 is formed. The light-emitting material layer 44R is formed on the array substrate 25 so as to overlap the pixel electrodes 16R, 16G, and 16B and the peeling layer 43R. The light-emitting material layer 44R is formed across the upper side of the first portion 161R, the upper side of the second portion 162R, and an upper side of the peeling layer 43R. The light-emitting material layer 44R is formed by applying a coating liquid including a red light-emitting material and a solvent to a surface to be coated to form a coating film, and evaporating the solvent from the formed coating film by heating. The solvent is octane or the like.

Figure 13:
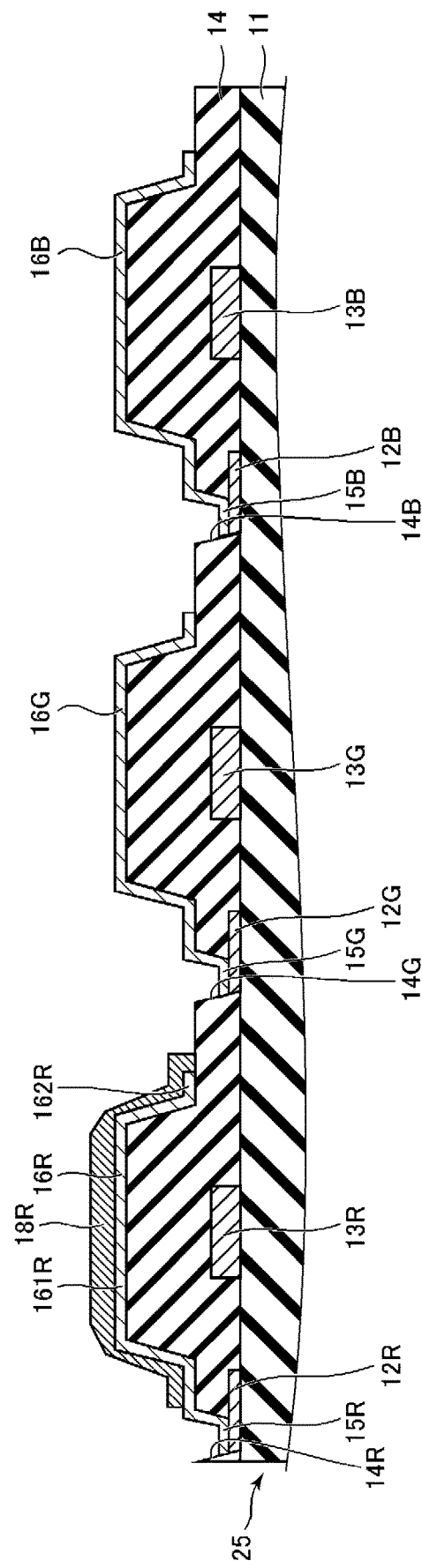
FIG. 13 is a cross-sectional view schematically illustrating an intermediate product acquired in the method for manufacturing a display device according to the first embodiment.

In subsequent step S106, the peeling layer 43R and a portion of the light-emitting material layer 44R formed on the upper side of the peeling layer 43R are lifted off. At this time, the peeling layer 43R is irradiated with the photosensitive beam. Further, the peeling layer 43R irradiated with the photosensitive beam is dissolved in the developing solution. In this way, the light-emitting layer 18R illustrated in FIG. 13 is formed from the light-emitting material layer 44R. The light-emitting layer 18R is formed across the upper side of the first portion 161R and the upper side of the second portion 162R.

When the red light-emitting material is mainly formed of quantum dots, the light-emitting material layer 44R is an aggregate of nanoparticles. Thus, when the red light-emitting material is mainly formed of quantum dots, the light-emitting material layer 44R can transmit the photosensitive beam and the developing solution. Thus, when the red light-emitting material is mainly formed of quantum dots, the peeling layer 43R can be irradiated with the photosensitive beam transmitted through the light-emitting material layer 44R, and the peeling layer 43R can be dissolved by the developing solution transmitted through the light-emitting material layer 44R. Therefore, when the red light-emitting material is mainly formed of quantum dots, the light-emitting material layer 44R does not inhibit the peeling of the peeling layer 43R. Alternatively, when a cross-sectional shape of the opening formed in the peeling layer 43R by dissolving a part of the photoresist film 41R is made to be an inversely tapered shape, the light-emitting material layer 44R is ruptured at a sidewall portion of the opening to form a ruptured portion, and the developing solution penetrates through the ruptured portion, and thus the peeling layer 43R can be dissolved by the developing solution. Therefore, the light-emitting material layer 44R does not inhibit the peeling of the peeling layer 43R.

In steps S103 to S106, the light-emitting material layer 44R is patterned by a lift-off process to form the light-emitting layer 18R.

Figure 14:
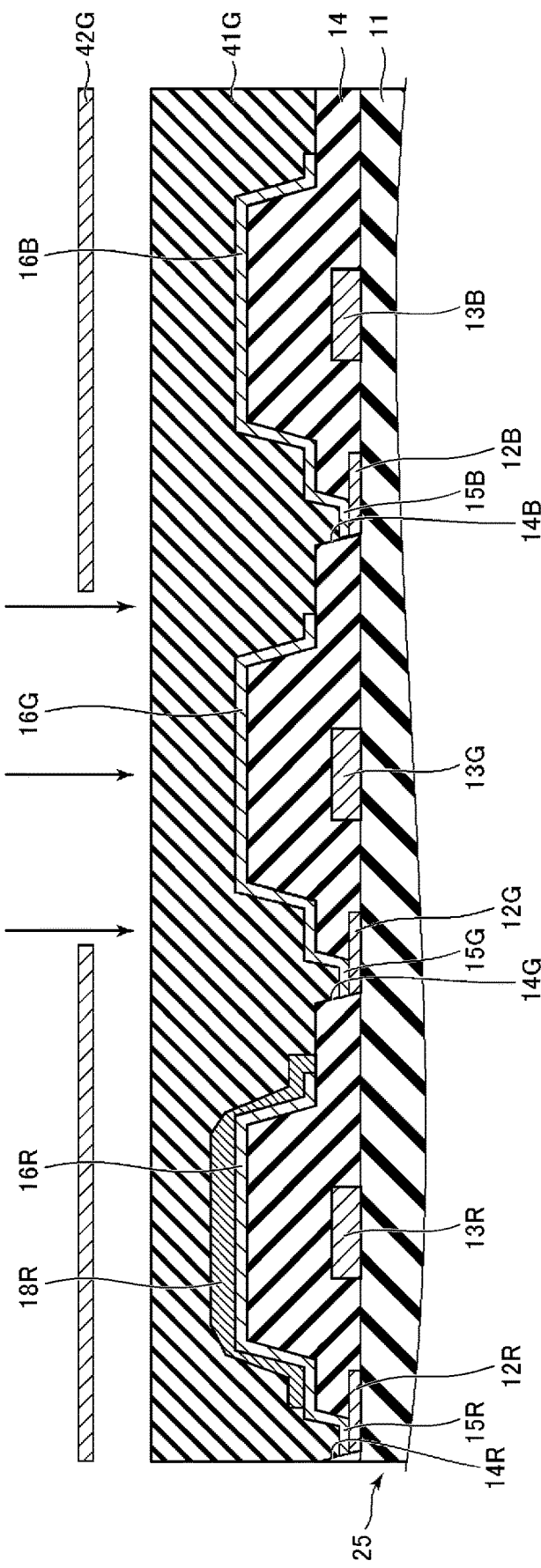
FIG. 14 is a cross-sectional view schematically illustrating an intermediate product acquired in the method for manufacturing a display device according to the first embodiment.

In subsequent step S107, a photoresist film 41G illustrated in FIG. 14 is formed. The photoresist film 41G is formed on the array substrate 25 so as to overlap the pixel electrodes 16R, 16G, and 16B and the light-emitting layer 18R. The photoresist film 41G can be formed of a material similar to the material forming the photoresist film 41R and can be formed by a method similar to the method for forming the photoresist film 41R.

In subsequent step S108, the photoresist film 41G is exposed through a mask 42G illustrated in FIG. 14. Further, the exposed photoresist film 41G is developed. At this time, a portion of the photoresist film 41G formed on the upper side of the pixel electrode 16G is irradiated with the photosensitive beam. Further, the portion irradiated with the photosensitive beam is dissolved in the developing solution.

Figure 15:
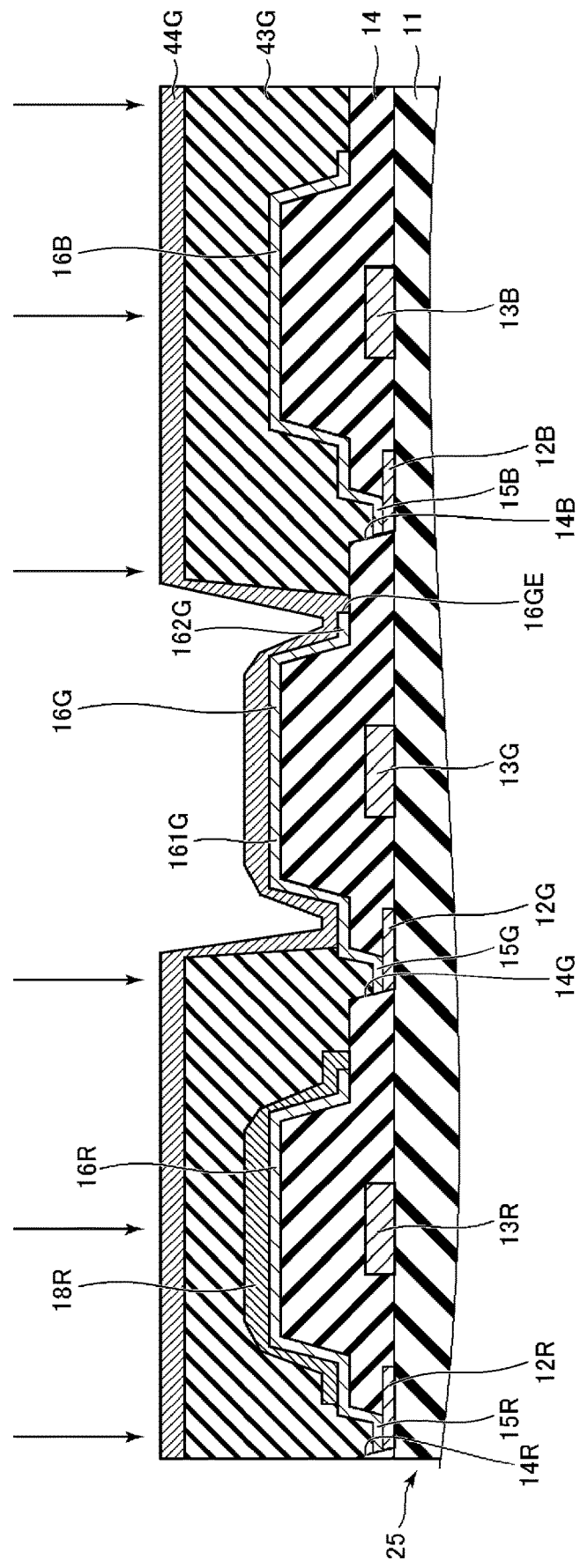
FIG. 15 is a cross-sectional view schematically illustrating an intermediate product acquired in the method for manufacturing a display device according to the first embodiment.

In steps S107 and S108, a peeling layer 43G illustrated in FIG. 15 is formed. The peeling layer 43G is formed outside the second portion 162G. An opening is formed in the peeling layer 43G and serves as a lift-off template. The second portion 162G is disposed inside the opening. The edge 16GE of the pixel electrode 16G may be disposed inside the opening.

In subsequent step S109, the light-emitting material layer 44G illustrated in FIG. 15 is formed. The light-emitting material layer 44G is formed on the array substrate 25 so as to overlap the pixel electrodes 16R, 16G, and 16B, the light-emitting layer 18R, and the peeling layer 43G. The light-emitting material layer 44G is formed across the upper side of the first portion 161G, the upper side of the second portion 162G, and an upper side of the peeling layer 43G. The light-emitting material layer 44G is formed by a method similar to the method of forming the light-emitting material layer 44R.

Figure 16:
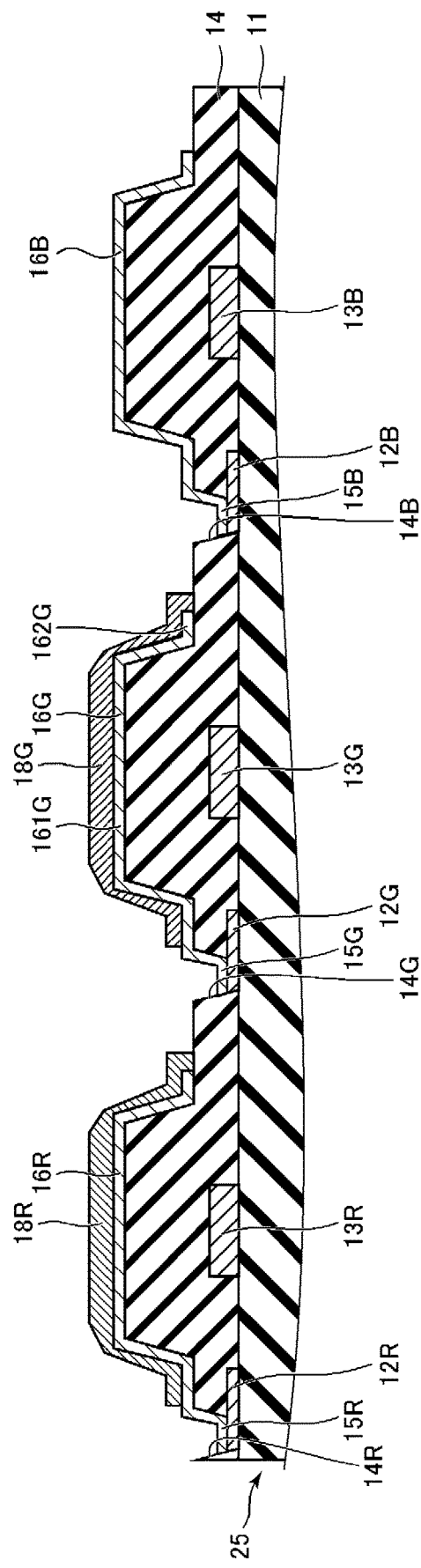
FIG. 16 is a cross-sectional view schematically illustrating an intermediate product acquired in the method for manufacturing a display device according to the first embodiment.

In subsequent step S110, the peeling layer 43G and a portion of the light-emitting material layer 44G formed on the upper side of the peeling layer 43G are lifted off. At this time, the peeling layer 43G is irradiated with the photosensitive beam. Further, the peeling layer 43G irradiated with the photosensitive beam is dissolved in the developing solution. In this way, the light-emitting layer 18G illustrated in FIG. 16 is formed from the light-emitting material layer 44G. The light-emitting layer 18G is formed across the upper side of the first portion 161G and the second portion 162G.

Also, when the green light-emitting material is mainly formed of quantum dots, the light-emitting material layer 44G does not inhibit the peeling of the peeling layer 43G. Alternatively, when a cross-sectional shape of the opening formed in the peeling layer 43G by dissolving a part of the photoresist film 41G is made to be an inversely tapered shape, the light-emitting material layer 44G is ruptured at a sidewall portion of the opening to form a ruptured portion, and the developing solution penetrates through the ruptured portion, and thus the peeling layer 43G can be dissolved by the developing solution. Therefore, the light-emitting material layer 44G does not inhibit the peeling of the peeling layer 43G.

In steps S107 to S110, the light-emitting material layer 44G is patterned by a lift-off process to form the light-emitting layer 18G.

Figure 17:
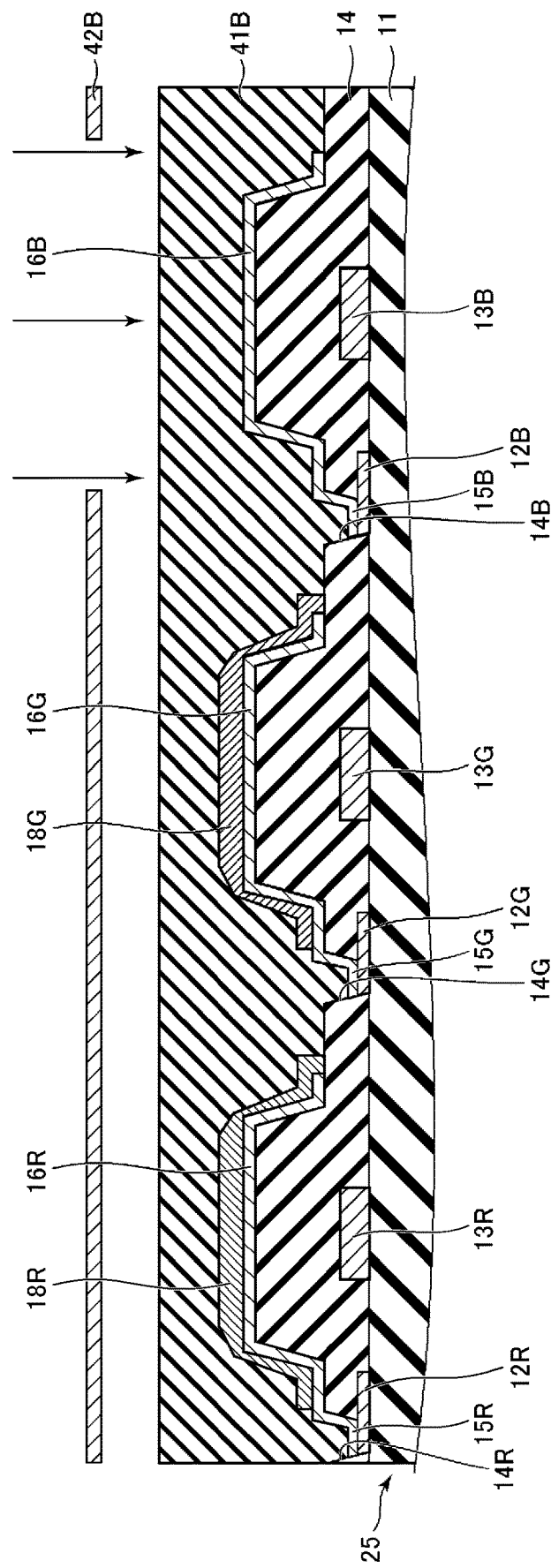
FIG. 17 is a cross-sectional view schematically illustrating an intermediate product acquired in the method for manufacturing a display device according to the first embodiment.

In subsequent step S111, a photoresist film 41B illustrated in FIG. 17 is formed. The photoresist film 41B is formed on the array substrate 25 so as to overlap the pixel electrodes 16R, 16G, and 16B and the light-emitting layers 18R and 18G. The photoresist film 41B can be formed of a material similar to the material forming the photoresist film 41R and can be formed by a method similar to the method for forming the photoresist film 41R.

In subsequent step S112, the photoresist film 41B is exposed through a mask 42B illustrated in FIG. 17. Further, the exposed photoresist film 41B is developed. At this time, a portion of the photoresist film 41B formed on the upper side of the pixel electrode 16B is irradiated with the photosensitive beam. Further, the portion irradiated with the photosensitive beam is dissolved in the developing solution.

Figure 18:
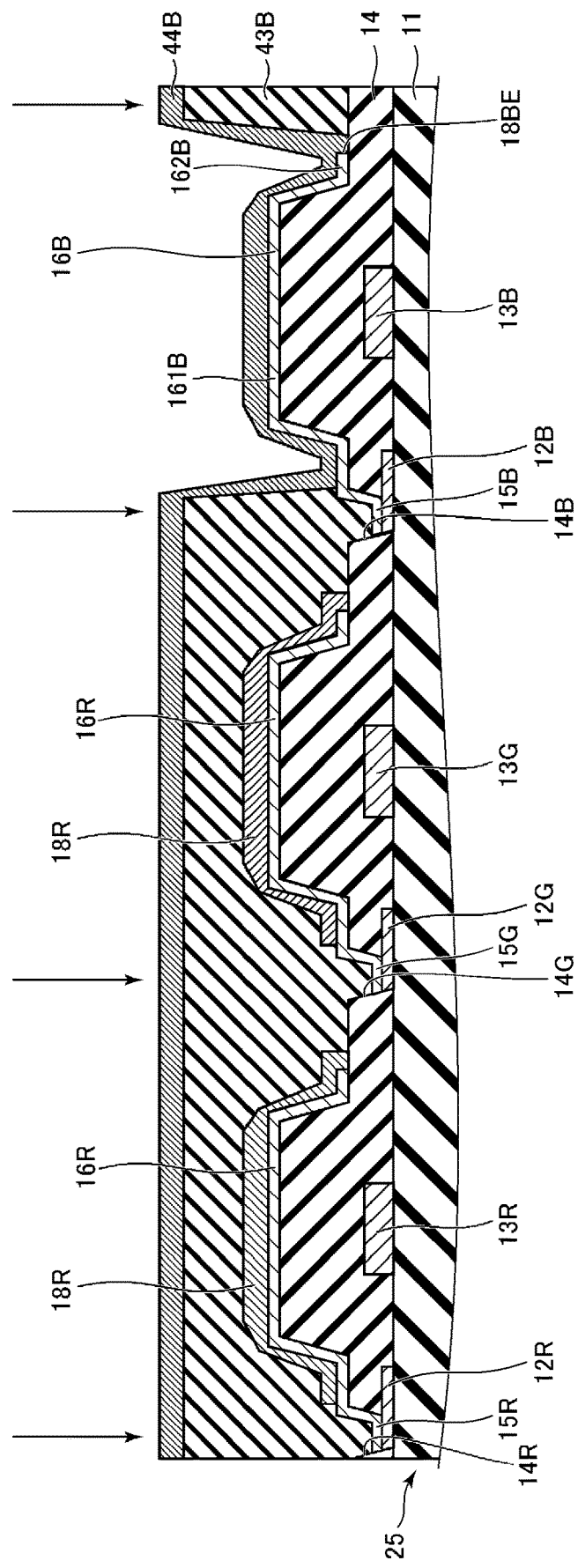
FIG. 18 is a cross-sectional view schematically illustrating an intermediate product acquired in the method for manufacturing a display device according to the first embodiment.

In steps S111 and S112, a peeling layer 43B illustrated in FIG. 18 is formed. The peeling layer 43B is formed outside the second portion 162B. An opening is formed in the peeling layer 43B and serves as a lift-off template. The second portion 162B is disposed inside the opening. The edge 16BE of the pixel electrode 16B may be disposed inside the opening.

In subsequent step S113, the light-emitting material layer 44B illustrated in FIG. 18 is formed. The light-emitting material layer 44B is formed on the array substrate 25 so as to overlap the pixel electrodes 16R, 16G, and 16B, the light-emitting layers 18R and 18G, and the peeling layer 43B. The light-emitting material layer 44B is formed across the upper side of the first portion 161B, the upper side of the second portion 162B, and an upper side of the peeling layer 43B. The light-emitting material layer 44B is formed by a method similar to the method of forming the light-emitting material layer 44R.

Figure 19:
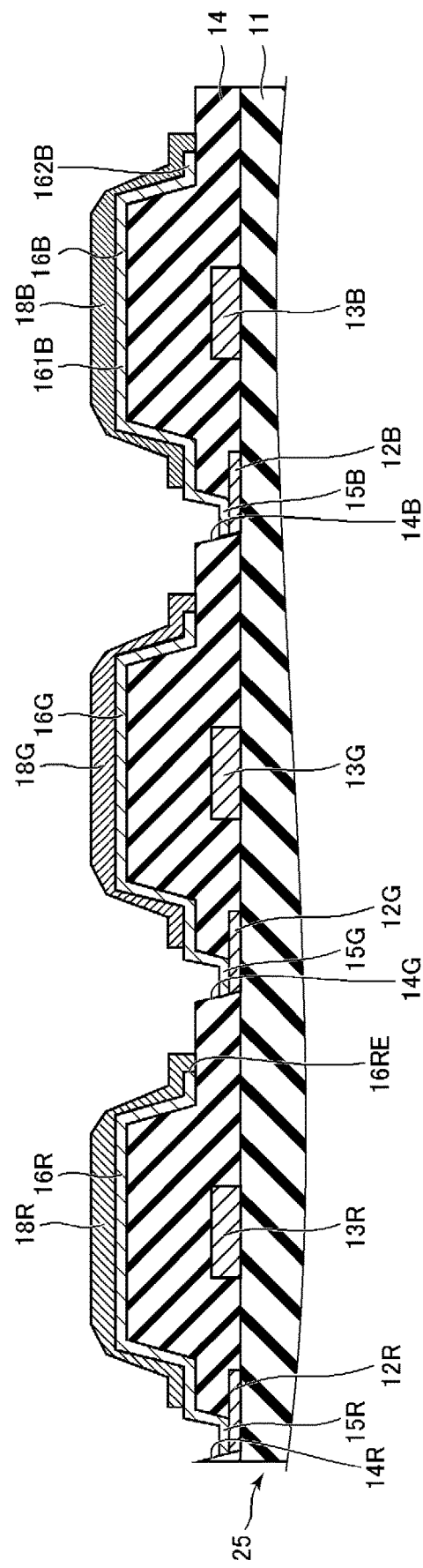
FIG. 19 is a cross-sectional view schematically illustrating an intermediate product acquired in the method for manufacturing a display device according to the first embodiment.

In subsequent step S114, the peeling layer 43B and a portion of the light-emitting material layer 44B formed on the upper side of the peeling layer 43B are lifted off. At this time, the peeling layer 43B is irradiated with the photosensitive beam. Further, the peeling layer 43B irradiated with the photosensitive beam is dissolved in the developing solution. In this way, the light-emitting layer 18B illustrated in FIG. 19 is formed from the light-emitting material layer 44B. The light-emitting layer 18B is formed across the upper side of the first portion 161B and the upper side of the second portion 162B.

Also, when the blue light-emitting material is mainly formed of quantum dots, the light-emitting material layer 44B does not inhibit the peeling of the peeling layer 43B. Alternatively, when a cross-sectional shape of the opening formed in the peeling layer 43B by dissolving a part of the photoresist film 41B is made to be an inversely tapered shape, the light-emitting material layer 44B is ruptured at a sidewall portion of the opening to form a ruptured portion, and the developing solution penetrates through the ruptured portion, and thus the peeling layer 43B can be dissolved by the developing solution. Therefore, the light-emitting material layer 44B does not inhibit the peeling of the peeling layer 43B.

In subsequent step S115, the edge covers 21RG, 21GB, and 21BR as illustrated in FIG. 3 and FIG. 4 are formed. The edge covers 21RG, 21GB, and 21BR are formed on the array substrate 25 so as to overlap the pixel electrodes 16R, 16G, and 16B and the light-emitting layers 18R, 18G, and 18B. The edge covers 21RG, 21GB, and 21BR are formed by photolithography.

In subsequent step S116, the common electrode 20 illustrated in FIG. 3 and FIG. 4 is formed. The common electrode 20 is formed on the array substrate 25 so as to overlap the pixel electrodes 16R, 16G, and 16B, the light-emitting layers 18R, 18G, and 18B, and the edge covers 21RG, 21GB, and 21BR.

The light-emitting layers 18R, 18G, and 18B may be formed by a process other than the lift-off process. For example, the light-emitting layers 18R, 18G, and 18B may be formed of a mixed material (QD-PR) of quantum dots and a photoresist. In this case, the light-emitting layers 18R, 18G, and 18B can be directly formed by patterning by photolithography.

3. Second Embodiment

Hereinafter, differences of a second embodiment from the first embodiment will be described. For points that are not described, a configuration similar to the configuration employed in the first embodiment is also employed in the second embodiment.

Figure 20:
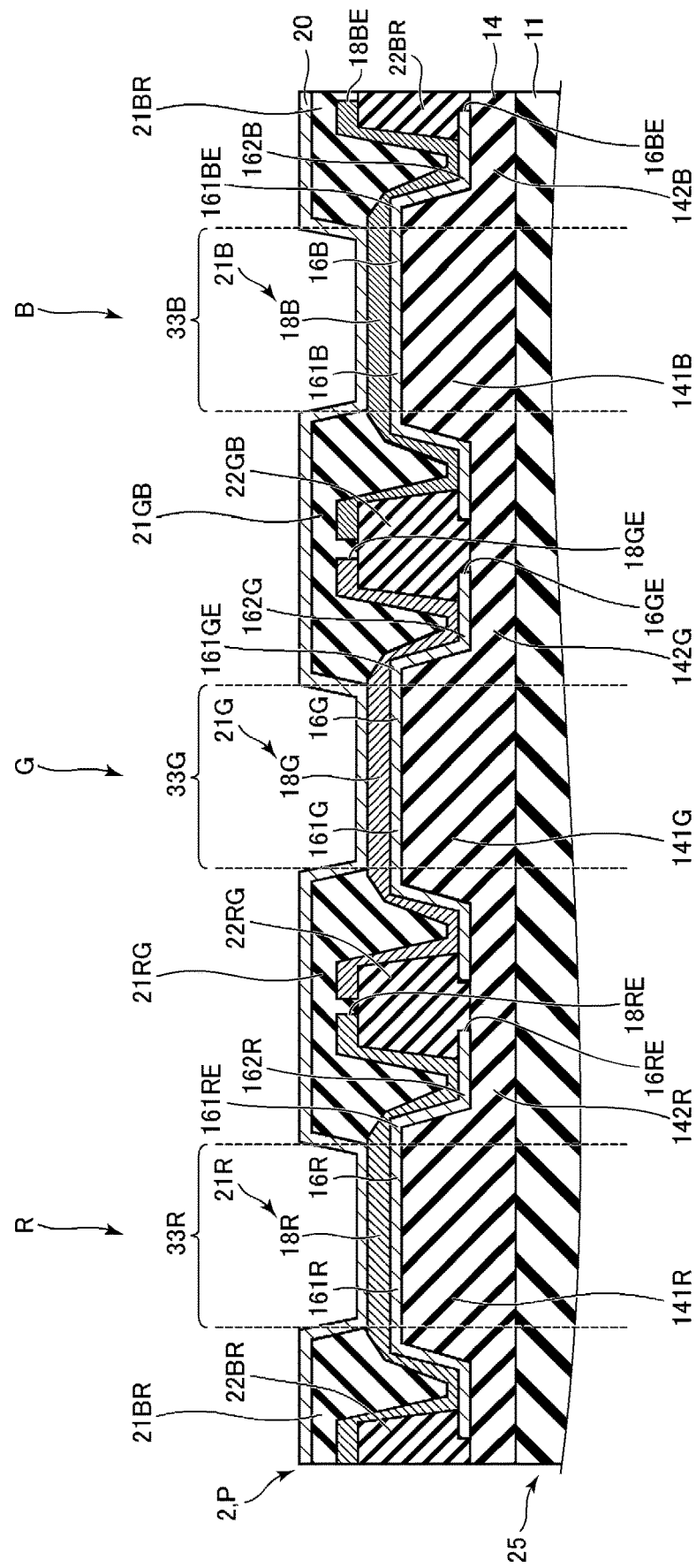
FIG. 20 is a cross-sectional view schematically illustrating each pixel included in a display device according to a second embodiment.

FIG. 20 is a cross-sectional view schematically illustrating each pixel P included in a display device 2 according to the second embodiment.

As illustrated in FIG. 20, the display device 2 includes first edge covers 21RG, 21GB, and 21BR and second edge covers 22RG, 22GB, and 22BR.

The first edge covers 21RG, 21GB, and 21BR provided in the display device 2 have roles similar to those of the edge covers 21RG, 21GB, and 21BR provided in the display device 1, respectively.

Thus, the first edge covers 21BR and 21RG are disposed across an upper side of a side edge portion of a first portion 161R and an upper side of a second portion 162R. In the first edge covers 21BR and 21RG, an opening 21R is formed on an upper side of a central portion of the first portion 161R. The first edge covers 21BR and 21RG cover an edge 161RE of the first portion 161R. In this way, a portion of a light-emitting layer 18R disposed on the upper side of the side edge portion of the first portion 161R and having a non-uniform thickness is covered by the first edge covers 21BR and 21RG. Further, a portion of the light-emitting layer 18R disposed on the upper side of the central portion of the first portion 161R and having a uniform thickness is not covered by the first edge covers 21BR and 21RG. Thus, a light-emitting region 33R is limited to the portion having the uniform thickness. Accordingly, the light emission intensity in the light-emitting region 33R can be made uniform.

Similarly, the first edge covers 21RG and 21GB are disposed across an upper side of a side edge portion of a first portion 161G and an upper side of a second portion 162G. In the first edge covers 21RG and 21GB, an opening 21G is formed on an upper side of a central portion of the first portion 161G. Further, the first edge covers 21RG and 21GB cover an edge 161GE of the first portion 161G. In this way, a portion of a light-emitting layer 18G disposed on the upper side of the side edge portion of the first portion 161G and having a non-uniform thickness is covered by the first edge covers 21RG and 21GB. Further, a portion of the light-emitting layer 18G disposed on the upper side of the central portion of the first portion 161G and having a uniform thickness is not covered by the first edge covers 21RG and 21GB. Thus, a light-emitting region 33G is limited to the portion having the uniform thickness. Accordingly, the light emission intensity in the light-emitting region 33G can be made uniform.

Similarly, the first edge covers 21GB and 21BR are disposed across an upper side of a side edge portion of a first portion 161B and an upper side of a second portion 162B. In the first edge covers 21GB and 21BR, an opening 21B is formed on an upper side of a central portion of the first portion 161B. Further, the first edge covers 21GB and 21BR cover an edge 161BE of the first portion 161B. In this way, a portion of a light-emitting layer 18B disposed on the upper side of the side edge portion of the first portion 161B and having a non-uniform thickness is covered by the first edge covers 21GB and 21BR. Further, a portion of the light-emitting layer 18B disposed on the upper side of the central portion of the first portion 161B and having a uniform thickness is not covered by the first edge covers 21GB and 21BR. Thus, a light-emitting region 33B is limited to the portion having the uniform thickness. Accordingly, the light emission intensity in the light-emitting region 33B can be made uniform.

An edge 18RE of the light-emitting layer 18R is located on the second edge covers 22BR and 22RG. Therefore, the second edge covers 22BR and 22RG are disposed on a lower side of the edge 18RE of the light-emitting layer 18R. Further, the second edge covers 22BR and 22RG cover an edge 16RE of the pixel electrode 16R.

Similarly, an edge 18GE of the light-emitting layer 18G is located on the second edge covers 22RG and 22GB. Therefore, the second edge covers 22RG and 22GB are disposed on a lower side of the edge 18GE of the light-emitting layer 18G. Further, the second edge covers 22RG and 22GB cover an edge 16GE of the pixel electrode 16G.

Similarly, an edge 18BE of the light-emitting layer 18B is located on the second edge covers 22GB and 22BR. Therefore, the second edge covers 22GB and 22BR are disposed on a lower side of the edge 18BE of the light-emitting layer 18B. Further, the second edge covers 22GB and 22BR cover an edge 16BE of the pixel electrode 16B.

Upper faces of the second edge covers 22BR and 22RG are flat. As described above, the edge 18RE of the of the light-emitting layer 18R is located on the upper faces of the second edge covers 22BR and 22RG. In this way, the light-emitting layer 18R can be formed by patterning in which the edge 18RE of the light-emitting layer 18R is disposed on the flat upper faces of the second edge covers 22BR and 22RG. Therefore, it is easy to form the light-emitting layer 18R by patterning.

Similarly, upper faces of the second edge covers 22RG and 22GB are flat. As described above, the edge 18GE of the of the light-emitting layer 18G is located on the upper faces of the second edge covers 22RG and 22GB. In this way, the light-emitting layer 18G can be formed by patterning in which the edge 18GE of the light-emitting layer 18G is disposed on the flat upper faces of the second edge covers 22RG and 22GB. Therefore, it is easy to form the light-emitting layer 18G by patterning.

Similarly, upper faces of the second edge covers 22GB and 22BR are flat. As described above, the edge 18BE of the of the light-emitting layer 18B is located on the upper faces of the second edge covers 22GB and 22BR. In this way, the light-emitting layer 18B can be formed by patterning in which the edge 18BE of the light-emitting layer 18B is disposed on the flat upper faces of the second edge covers 22GB and 22BR. Therefore, it is easy to form the light-emitting layer 18B by patterning.

In the display device 2, by using the second edge covers 22RG, 22GB, and 22BG as partitions, the light-emitting layers 18R, 18G, and 18B can be separately patterned by an ink-jet method.

4. Third Embodiment

Hereinafter, differences of a third embodiment from the first embodiment will be described. For points that are not described, a configuration similar to the configuration employed in the first embodiment is also employed in the third embodiment.

Figure 21:
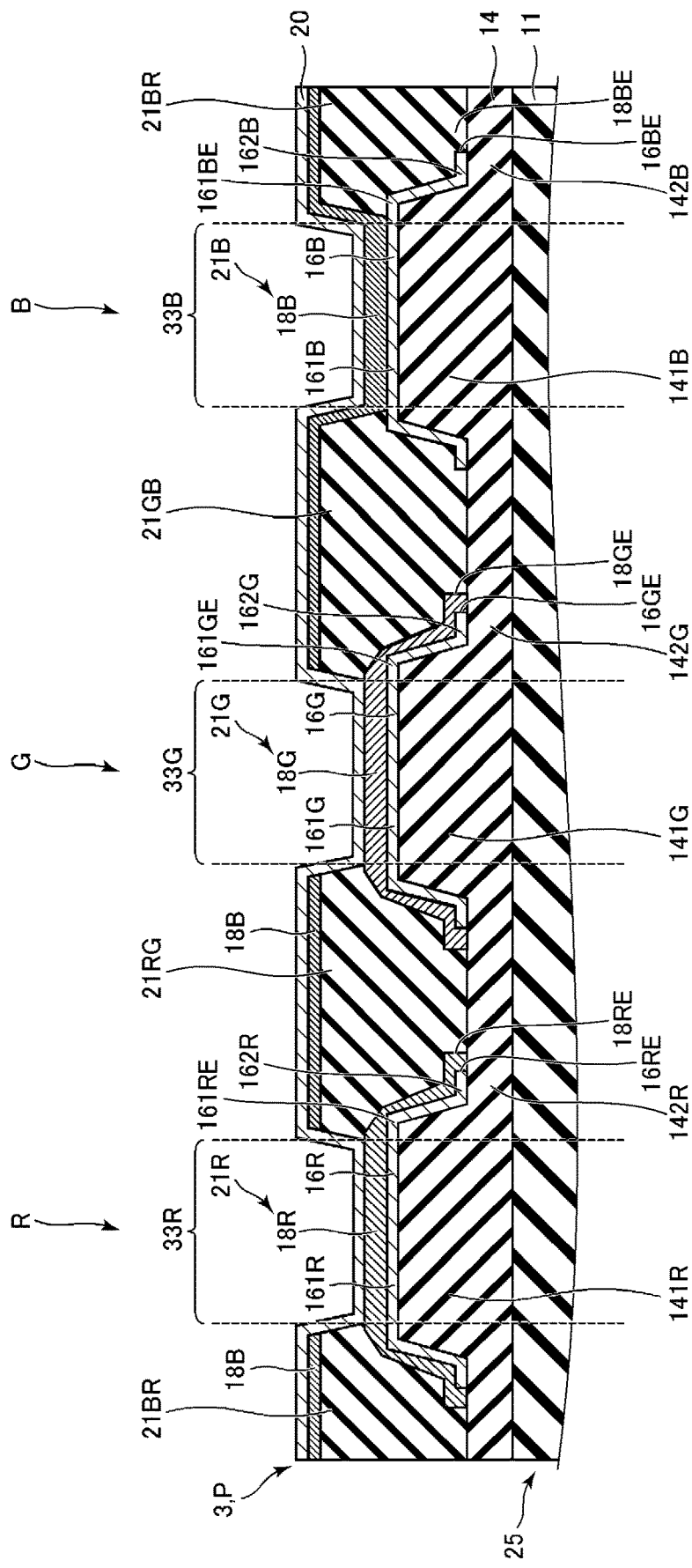
FIG. 21 is a cross-sectional view schematically illustrating each pixel included in a display device according to a third embodiment.

FIG. 21 is a cross-sectional view schematically illustrating each pixel P included in a display device 3 according to the third embodiment.

In the display device 3, a light-emitting layer 18B having a color different from colors of light-emitting layers 18R and 18G is disposed across an upper side of a pixel electrode 16B, an upper side of an edge cover 21RG, an upper side of an edge cover 21GB, and an upper side of an edge cover 21BR.

The display device 3 can be manufactured by leaving a part of a photoresist film 41B as the edge covers 21RG, 21GB, and 21BR. By manufacturing the display device 3 in such a manner, the light-emitting layer 18B and the edge covers 21RG, 21GB, and 21BR can be formed at the same time, and a process of manufacturing the display device 3 can be shortened.

In the display device 3, a light-emitting material layer 44B is formed by vapor deposition, and thus a thickness of the light-emitting layer 18B can be made uniform. When a solvent including an organic compound is used as a vapor deposition source in a case where the light-emitting material layer 44B is formed by vapor deposition, the light-emitting material layer 44B can be formed by mist deposition. When the light-emitting material layer 44B is formed by mist deposition, for example, a quantum dot solution is atomized to form a mist including quantum dots, and the formed mist is attached to a formation surface to form a film including quantum dots on the formation surface.

The disclosure is not limited to the embodiments described above, and may be substituted with a configuration that is substantially the same as the configuration described in the embodiments described above, a configuration that achieves the same action and effect, or a configuration capable of achieving the same object.

The invention claimed is:

1. A display device comprising:
   a substrate;
   a pixel electrode disposed on the substrate, the pixel electrode including a first portion and a second portion disposed outside the first portion, the first portion protruding to a second side opposite to a first side closer to the substrate than the second portion;
   a light-emitting layer disposed across the second side of the first portion and the second side of the second portion;
   a first edge cover disposed across the second side of a side edge portion of the first portion and the second side of the second portion, the first edge cover including an opening formed on the second side of a central portion of the first portion, the first edge cover covering an edge of the first portion; and
   a counter electrode including a portion disposed closer to the second side than the first edge cover, and facing the pixel electrode with the light-emitting layer interposed between the counter electrode and the pixel electrode.

2. The display device according to claim 1, further comprising:
- an interlayer insulating film including a contact hole located outside the second portion;
- a wiring line including a portion disposed on the first side of the contact hole; and
- a connection conductor disposed inside the contact hole, and configured to electrically connect the pixel electrode and the wiring line to each other.

3. The display device according to claim 2,
wherein the interlayer insulating film includes a first film portion disposed on the first side of the first portion, and a second film portion disposed on the first side of the second portion, and
the first film portion protrudes closer to the second side than the second film portion.

4. The display device according to claim 1, further comprising:
- a second edge cover disposed on the first side of an edge of the light-emitting layer, and covering an edge of the pixel electrode.

5. The display device according to claim 1, further comprising:
- an inorganic material structure disposed on the first side of the pixel electrode, having a first height on the first side of the first portion, and having a second height lower than the first height on the first side of the second portion.

6. The display device according to claim 5,
wherein the inorganic material structure includes
a first element disposed on the first side of the first portion, and
a second element disposed on the first side of the second portion, and being smaller in number than the first element.

7. The display device according to claim 6,
wherein the first element includes at least one type selected from the group consisting of a first switching element, a first capacitor, and a first wiring line, and
the second element includes at least one type selected from the group consisting of a second switching element, a second capacitor, and a second wiring line.

8. The display device according to claim 1, further comprising:
- a function layer entirely disposed across the first side of the light-emitting layer.

9. The display device according to claim 8,
wherein the function layer includes at least one type selected from the group consisting of a charge transport layer, a charge injection layer, and a charge blocking layer.

10. The display device according to claim 1, further comprising:
- two pixels adjacent to each other,
wherein each of the pixels adjacent to each other includes the light-emitting layer, and
two light-emitting layers respectively included in the two pixels adjacent to each other are separated from each other.

11. The display device according to claim 1, further comprising:
- two pixels adjacent to each other,
wherein each of the pixels adjacent to each other includes the light-emitting layer, and
side edge portions of two light-emitting layers respectively included in the two pixels adjacent to each other overlap each other.

12. The display device according to claim 1, further comprising:
- another light-emitting layer disposed on the first edge cover, and having a color different from a color of the light-emitting layer.

13. A method for manufacturing a display device, comprising:
a) preparing a substrate;
b) forming a pixel electrode disposed on the substrate, the pixel electrode including a first portion and a second portion disposed outside the first portion, the first portion protruding to a second side opposite to a first side closer to the substrate than the second portion;
c) forming a peeling layer outside the second portion;
d) forming a light-emitting material layer across the second side of the first portion, the second side of the second portion, and the second side of the peeling layer;
e) forming, from the light-emitting material layer, a light-emitting layer disposed across the second side of the first portion and the second side of the second portion, by lifting off the peeling layer and a portion of the light-emitting material layer formed on the second side of the peeling layer; and
f) forming, across the second side of a side edge portion of the first portion and the second side of the second portion, an edge cover including an opening located on the second side of a central portion of the first portion, the edge cover covering an edge of the pixel electrode.

* * * * *